US012740285B2

(12) United States Patent
Yamazaki et al.

(10) Patent No.: US 12,740,285 B2
(45) Date of Patent: Sep. 15, 2026

(54) METHOD FOR FABRICATING DISPLAY APPARATUS COMPRISING FORMING CONDUCTIVE LAYER ELECTRICALLY CONNECTED TO CATHODES OF LIGHT-EMITTING ELEMENTS

(71) Applicant: Semiconductor Energy Laboratory Co., Ltd., Kanagawa-ken (JP)

(72) Inventors: Shunpei Yamazaki, Tokyo (JP); Shingo Eguchi, Atsugi (JP); Kenichi Okazaki, Atsugi (JP); Koji Kusunoki, Isehara (JP); Kensuke Yoshizumi, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 525 days.

(21) Appl. No.: 18/039,860

(22) PCT Filed: Nov. 25, 2021

(86) PCT No.: PCT/IB2021/060953
§ 371 (c)(1),
(2) Date: Jun. 1, 2023

(87) PCT Pub. No.: WO2022/123383
PCT Pub. Date: Jun. 16, 2022

(65) Prior Publication Data

US 2024/0023371 A1 Jan. 18, 2024

(30) Foreign Application Priority Data

Dec. 7, 2020 (JP) ................................ 2020-202409

(51) Int. Cl.
*H10K 59/80* (2023.01)
*H10K 59/12* (2023.01)
(Continued)

(52) U.S. Cl.
CPC ... *H10K 59/80522* (2023.02); *H10K 59/1201* (2023.02); *H10K 71/231* (2023.02); *H10K 71/621* (2023.02)

(58) Field of Classification Search
None
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 108574057 A 9/2018
CN 109509765 A 3/2019
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Daniel Whalen
(74) *Attorney, Agent, or Firm* — Husch Blackwell LLP

(57) ABSTRACT

A novel method for fabricating a display apparatus is provided. An anode is formed over an insulating layer, an EL layer is formed over the anode, and a cathode is formed over the EL layer. A plurality of light-emitting elements are formed without provision of a partition by selectively removing parts of the anode, the EL layer, and the cathode. A conductive layer having a light-transmitting property is formed to cover the plurality of light-emitting elements. The cathodes of the plurality of light-emitting elements are electrically connected to the conductive layer.

16 Claims, 18 Drawing Sheets

(51) Int. Cl.
*H10K 71/00* (2023.01)
*H10K 71/20* (2023.01)

(56) References Cited

U.S. PATENT DOCUMENTS

| | | | |
|---|---|---|---|
| 6,906,344 B2 | 6/2005 | Yamazaki et al. | |
| 7,154,119 B2 | 12/2006 | Yamazaki et al. | |
| 7,535,022 B2 | 5/2009 | Yamazaki et al. | |
| 2001/0049030 A1 | 12/2001 | Okada et al. | |
| 2002/0072139 A1 | 6/2002 | Kashiwabara | |
| 2003/0006699 A1* | 1/2003 | Ogino | H10K 71/00 313/506 |
| 2003/0015703 A1 | 1/2003 | Yamazaki et al. | |
| 2003/0232563 A1 | 12/2003 | Kamiyama et al. | |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2014/0175469 A1 | 6/2014 | Dozen et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2018/0261792 A1 | 9/2018 | Kwon et al. | |
| 2020/0203662 A1 | 6/2020 | Mollard et al. | |
| 2024/0155869 A1* | 5/2024 | Eguchi | H10K 71/166 |
| 2024/0306423 A1* | 9/2024 | Yamazaki | H10K 59/12 |

FOREIGN PATENT DOCUMENTS

| | | |
|---|---|---|
| JP | 10-208883 A | 8/1998 |
| JP | 2000-036385 A | 2/2000 |
| JP | 2003-051599 A | 2/2003 |
| JP | 2003-059663 A | 2/2003 |
| JP | 2003-157973 A | 5/2003 |
| JP | 2003-347053 A | 12/2003 |
| JP | 2008-098106 A | 4/2008 |
| JP | 2008-147072 A | 6/2008 |
| JP | 2008-251270 A | 10/2008 |
| JP | 2014-120218 A | 6/2014 |
| JP | 2014-123527 A | 7/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| KR | 2018-0104227 A | 9/2018 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2021/060953) Dated Mar. 22, 2022.

Written Opinion (Application No. PCT/IB2021/060953) Dated Mar. 22, 2022.

* cited by examiner 100
235
232
233
124
A2
A1
121
111
240
230B
230G
230R 235
233
230R
230G
230B
131R
131G
131B
132
175R
175G
175B
175
121
133
142
116
115
138
124
213
210
112
111
A2
229
228
252
170
251
125
173
172
171
A1
122
142
118
117
170
114
113

FIG. 14A
Intermediate state
New crystalline phase
| Amorphous | Crystalline | Crystal |
|---|---|---|
| ・completely amorphous | ・CAAC<br>・nc<br>・CAC<br>excluding single crystal and poly crystal | ・single crystal<br>・poly crystal |
FIG. 14B
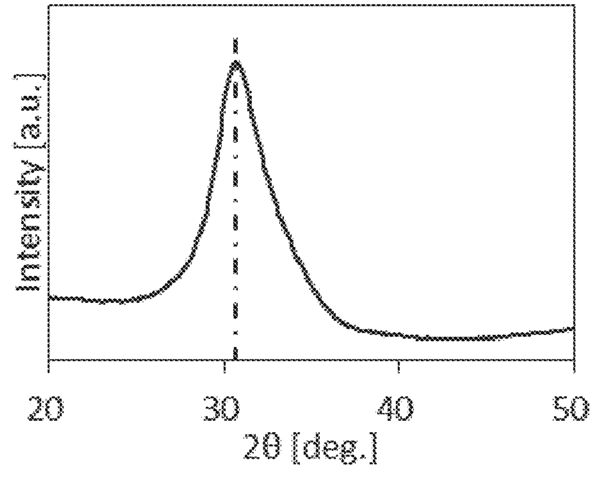
FIG. 14C
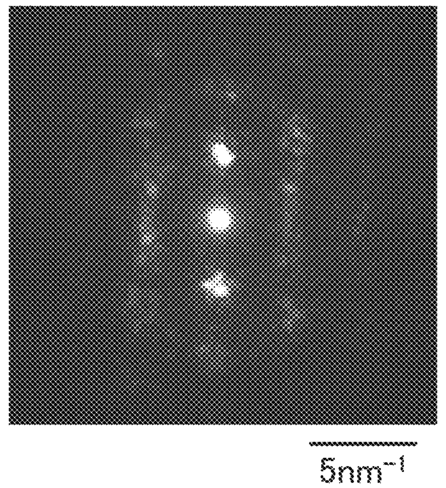

METHOD FOR FABRICATING DISPLAY APPARATUS COMPRISING FORMING CONDUCTIVE LAYER ELECTRICALLY CONNECTED TO CATHODES OF LIGHT-EMITTING ELEMENTS

This application is a 371 of international application PCT/IB2021/060953 filed on Nov. 25, 2021 which is incorporated herein by reference.

TECHNICAL FIELD

One embodiment of the present invention relates to a method for fabricating a display device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a semiconductor device, a display apparatus, a light-emitting apparatus, a power storage device, a memory device, a driving method thereof, and a manufacturing method thereof.

BACKGROUND ART

An active-matrix display apparatus where a transistor for driving a display element is provided in each pixel is known as a display apparatus. For example, an active-matrix liquid crystal display apparatus (also referred to as "liquid crystal display") that uses a liquid crystal element as a display element, an active-matrix light-emitting display apparatus (also referred to as "organic EL display" that uses a light-emitting element such as an organic EL element as a display element, and the like are known.

An organic EL display is a self-luminous display apparatus, and thus has a wider viewing angle and higher responsiveness than a liquid crystal display. In addition, an organic EL display does not need a backlight, which makes it easy to achieve a reduction in weight, thickness, power consumption, or the like of a display apparatus and leads to an active research in recent years. An organic EL element functioning as a pixel has a structure where an anode and a cathode overlap with each other with a light-emitting layer therebetween. Furthermore, in an organic EL display, a partition is provided between adjacent pixels to prevent electric interference between adjacent light-emitting layers (Patent Document 1).

In the case where an organic EL layer such as a light-emitting layer is formed using a low molecular material, a method performed by a vacuum evaporation method using a metal mask is known (Patent Document 2).

REFERENCES

Patent Documents

[Patent Document 1] Japanese Published Patent Application No. 2014-123527

[Patent Document 2] Japanese Published Patent Application No. 2003-157973

SUMMARY OF THE INVENTION

Problems to be Solved by the Invention

A partition (also referred to as "embankment" or "bank") provided between pixels offers effects such as an improvement in display quality and a reduction in power consumption of a display apparatus. In contrast, a certain number of partitions are needed to obtain a sufficient effect, which has made a reduction in area occupied by the partition difficult, and made an improvement in pixel aperture ratio, an increase in resolution, a reduction in size, and the like difficult.

In addition, a metal mask is inferior to a resist mask in the size accuracy; thus, formation of a light-emitting layer with the use of a metal mask has had a difficulty in achieving an improvement in pixel aperture ratio, an increase in resolution, and the like. Furthermore, a metal mask has a problem of being easily deformed by influence of heat generated by an evaporation source.

An object of one embodiment of the present invention is to provide a display apparatus, a semiconductor device, or the like having favorable display quality. Another object is to provide a highly reliable display apparatus, semiconductor device, or the like. Another object is to provide a display apparatus, a semiconductor device, or the like with low power consumption. Another object is to provide a lightweight display apparatus, semiconductor device, or the like. Another object is to provide a display apparatus, a semiconductor device, or the like with high productivity. Another object is to provide a novel display apparatus, semiconductor device, or the like.

Note that the description of these objects does not preclude the existence of other objects. One embodiment of the present invention does not need to achieve all these objects. Note that other objects will be apparent from the description of the specification, the drawings, the claims, and the like, and other objects can be derived from the description of the specification, the drawings, the claims, and the like.

Means for Solving the Problems (1) One embodiment of the present invention is a method for fabricating a display apparatus, including a step of forming an anode over an insulator; a step of forming an EL layer over the anode; a step of forming a cathode over the EL layer; a step of selectively removing parts of the anode, the EL layer, and the cathode to form a plurality of light-emitting elements; and a step of forming a conductive layer covering the plurality of light-emitting elements. The cathode of each of the plurality of light-emitting elements is electrically connected to the conductive layer. The conductive layer has a light-transmitting property.

(2) One embodiment of the present invention is a method for fabricating a display apparatus, including a step of forming an anode over an insulating layer; a step of forming an EL layer over the anode; a step of forming a cathode over the EL layer; a step of selectively removing parts of the anode, the EL layer, and the cathode to form a plurality of light-emitting elements; and a step of forming a conductive layer over the plurality of light-emitting elements. At least in some of the plurality of light-emitting elements, the cathodes of the light-emitting elements adjacent to each other are electrically connected to the conductive layer.

Another embodiment of the present invention is the method for fabricating a display apparatus, according to (1) or (2), further including a step of forming a plurality of transistors over a substrate and a step of forming the insulating layer over the plurality of transistors. The insulating layer includes a surface of the insulating layer serving as a formation surface with reduced unevenness.

The transistor preferably includes an oxide semiconductor in a semiconductor layer where a channel is formed. The oxide semiconductor preferably contains at least one of indium and zinc.

Effect of the Invention

One embodiment of the present invention can provide a display apparatus, a semiconductor device, or the like having favorable display quality. Alternatively, a highly reliable display apparatus, semiconductor device, or the like can be provided. Alternatively, a display apparatus, a semiconductor device, or the like with low power consumption can be provided. Alternatively, a lightweight display apparatus, semiconductor device, or the like can be provided. Alternatively, a display apparatus, a semiconductor device, or the like with high productivity can be provided. Alternatively, a novel display apparatus, semiconductor device, or the like can be provided.

Note that the description of these effects does not preclude the existence of other effects. One embodiment of the present invention does not have to have all these effects. Note that other effects will be apparent from the description of the specification, the drawings, the claims, and the like and other effects can be derived from the description of the specification, the drawings, the claims, and the like.

BRIEF DESCRIPTION OF THE DRAWINGS

FIG. 7A1, FIG. 7A2, and FIG. 7B are diagrams illustrating a fabrication method example of the first element substrate.

FIG. 13 is a diagram illustrating a variation example of a display apparatus.

FIG. 14A is a diagram showing the classification of crystal structures of IGZO. FIG. 14B is a diagram showing an XRD spectrum of a CAAC-IGZO film. FIG. 14C is a diagram showing a nanobeam electron diffraction pattern of a CAAC-IGZO film.

FIG. 15A and FIG. 15B1 to FIG. 15B5 are diagrams illustrating structure examples of a display apparatus.

MODE FOR CARRYING OUT THE INVENTION

Figures 1A, 1B, 1C:
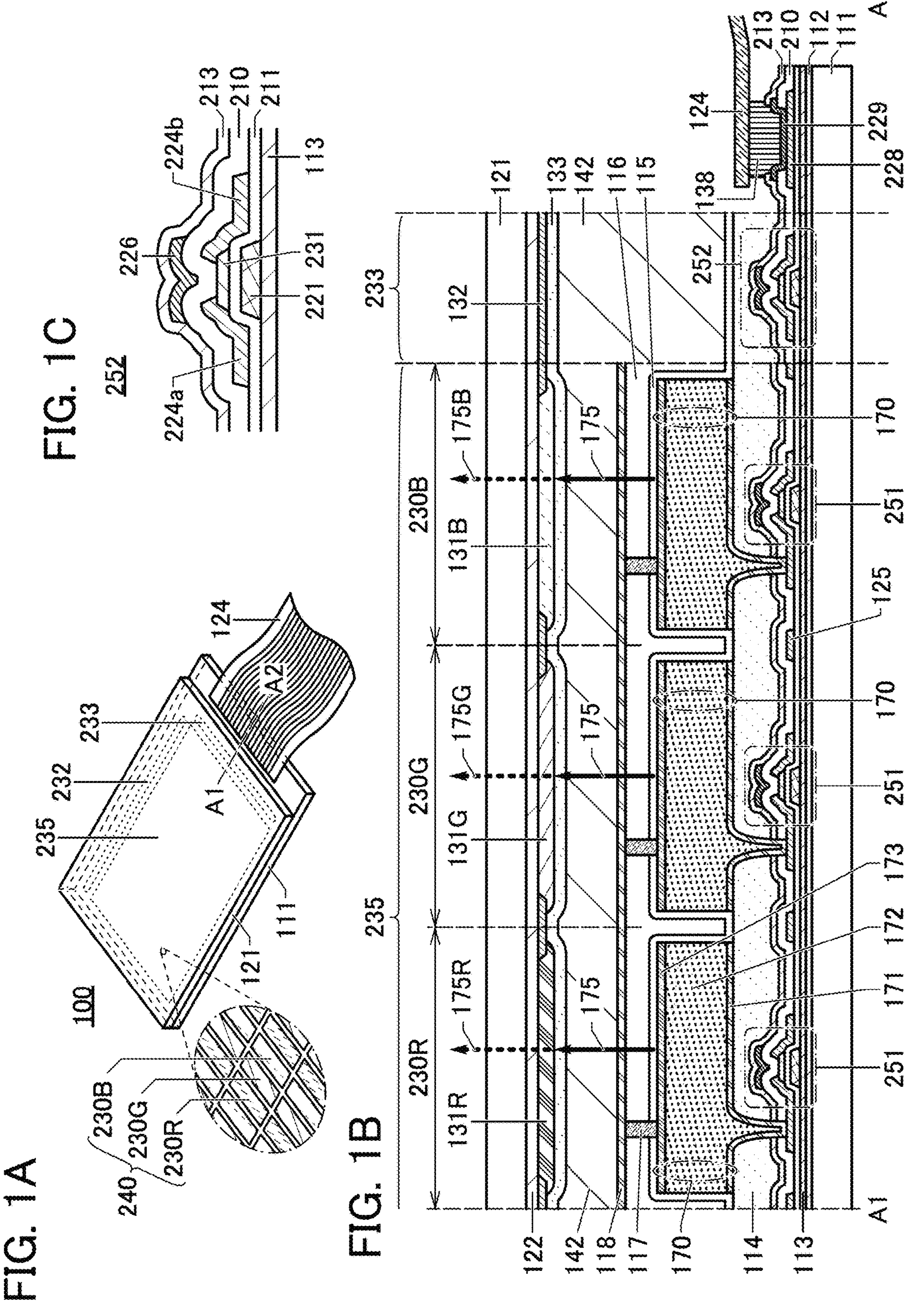
FIG. 1A to FIG. 1C are diagrams illustrating a structure example of a display apparatus.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display apparatus, a light-emitting apparatus, a lighting device, an electronic device, and the like themselves may be semiconductor devices or may each include a semiconductor device.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch is controlled to be in an on state or an off state. That is, a switch has a function of controlling whether or not current flows by being in a conduction state (on state) or a non-conduction state (off state).

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order.". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In addition, in this specification and the like, as a "resistor," a circuit element, a wiring, or the like having a resistance value higher than 0Ω can be used, for example. Therefore, in this specification and the like, a "resistor" sometimes includes a wiring having a resistance value, a transistor in which current flows between its source and drain, a diode, and a coil. Thus, the term "resistor" can be replaced with the term such as "resistance", "load", or "region having a resistance value"; conversely, the term "resistance", "load", or "region having a resistance value" can be replaced with the term such as "resistor". The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1\times10^9$Ω.

In the case where a wiring is used as a resistor, the resistance value is sometimes determined depending on the length of the wiring. Alternatively, a conductor with resistivity different from that of a conductor used as a wiring is sometimes used as a resistor. Alternatively, the resistance value is sometimes determined by doping a semiconductor with an impurity.

In this specification and the like, a "capacitor" refers to, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "a pair of electrodes" of a "capacitor" can be replaced with "a pair of conductors", "a pair of conductive regions", "a pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a "node" can be referred to as a terminal, a wiring, an electrode, a conductive layer, a conductor, an impurity region, or the like depending on the circuit structure, the device structure, or the like. Furthermore, a terminal, a wiring, or the like can be referred to as a "node."

In this specification and the like, "voltage" and "potential" can be replaced with each other as appropriate. "Voltage" refers to a potential difference from a reference potential, and when the reference potential is a ground potential, for example, "voltage" can be replaced with "potential".

Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In addition, in this specification and the like, the terms "high-level potential" (also referred to as "H potential" or "H") and "low-level potential" (also referred to as "L potential" or "L") do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of a current (or the direction of current) is not specified in this specification and the like, the description "current flows from element A to element B" can be rephrased as "current flows from element B to element A," for example. The description "current is input to element A" can be rephrased as "current is output from element A", for example.

Ordinal numbers such as "first", "second", and "third" in this specification and the like are used to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments, the scope of claims, or the like. Furthermore, for example, a "first" component in one embodiment in this specification and the like can be omitted in other embodiments, the scope of claims, or the like.

In this specification and the like, terms for describing arrangement, such as "over", "under", "above", and "below" are sometimes used for convenience to describe the positional relation between components with reference to drawings. The positional relation between components is changed as appropriate in accordance with a direction in which each component is described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

The term "over" or "under" does not necessarily mean that a component is placed directly over or directly under and directly in contact with another component. For example, the expression "electrode B over insulating layer A" does not necessarily mean that the electrode B is formed over and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film," "layer," or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In addition, in this specification and the like, the term such as "electrode," "wiring," or "terminal" does not limit the function of a component. For example, an "electrode" is used as part of a wiring in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In addition, in this specification and the like, the term such as "wiring," "signal line," or "power supply line" can be interchanged with each other depending on the case or the situation. For example, the term "wiring" can be changed into the term "signal line" in some cases. As another example, the term "wiring" can be changed into the term "power supply line" or the like in some cases. Conversely, the term such as "signal line" or "power supply line" can be changed into the term "wiring" in some cases. The term "power supply line" or the like can be changed into the term "signal line" or the like in some cases. Conversely, the term "signal line" or the like can be changed into the term "power supply line" or the like in some cases. Moreover, the term "potential" that is applied to a wiring can be sometimes changed into the term such as "signal" depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include oxygen, Group 1 elements except hydrogen, Group 2 elements, Group 13 elements, Group 15 elements, and the like.

In this specification and the like, a switch has a function of controlling whether current flows or not by being in a conduction state (an on state) or a non-conduction state (an off state). Alternatively, a switch has a function of selecting and changing a current path. For example, an electrical switch or a mechanical switch can be used. That is, a switch can be any element capable of controlling current, and is not limited to a particular element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (Micro Electro Mechanical Systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor where a channel is formed, the metal oxide is referred to as an oxide semiconductor in some cases. That is, when a metal oxide is used in a semiconductor layer, where a channel is formed, of a transistor that has at least one of an amplifying function, a rectifying function, and a switching function, the metal oxide can be referred to as a metal oxide semiconductor. Furthermore, in this specification and the like, a transistor including a metal oxide or an oxide semiconductor in its semiconductor layer where a channel is formed can be referred to as an "OS transistor".

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be interpreted as being limited to the description in the embodiments. Note that in the structures of the invention in the embodiments, the same reference numerals are used in common for the same portions or portions having similar functions in different drawings, and repeated description thereof is omitted in some cases. Moreover, some components are omitted in a perspective view, a top view, and the like for easy understanding of the diagrams in some cases.

In addition, in the drawings in this specification, the size, the layer thickness, or the region is exaggerated for clarity in some cases. Therefore, embodiments of the present invention are not limited to the size, aspect ratio, and the like shown in the drawings. Note that the drawings schematically show ideal examples, and embodiments of the present invention are not limited to shapes, values, and the like shown in the drawings. For example, variation in signal, voltage, or current due to noise or variation in signal, voltage, or current due to difference in timing can be included.

In this specification and the like, when a plurality of components are denoted by the same reference numerals, and in particular need to be distinguished from each other, an identification character such as "A", "a", "_1", "[i]", or "[m,n]" is sometimes added to the end of each reference numeral. For example, one of a plurality of coloring layers 131 is denoted by a coloring layer 131R and another one is denoted by a coloring layer 131G in some cases.

In this specification and the like, a device formed using a metal mask or an FMM (fine metal mask) may be referred to as a device having an MM (metal mask) structure. In this specification and the like, a device formed without using a metal mask or an FMM may be referred to as a device having an MML (metal maskless) structure.

Embodiment 1

A display apparatus 100 of one embodiment of the present invention is described with reference to drawings.

Structure Example

FIG. 1A is a schematic perspective view of the display apparatus 100. The display apparatus 100 has a structure where a substrate 111 and a substrate 121 are bonded to each other. The display apparatus 100 includes a display region 235, a peripheral circuit region 232, a peripheral circuit region 233, and the like. FIG. 1 illustrates an example where an FPC 124 is mounted on the display apparatus 100. Thus, the structure illustrated in FIG. 1A can be regarded as a display module including the display apparatus 100 and the FPC 124.

The peripheral circuit region 232 and the peripheral circuit region 233 each include a circuit for supplying a signal to the display region 235. The circuits included in the peripheral circuit region 232 and the peripheral circuit region 233 are collectively referred to as a "peripheral driver circuit" in some cases. Examples of the peripheral driver circuit include a scan line driver circuit and a signal line driver circuit.

Part or the whole of the peripheral driver circuit may be mounted as an IC (integrated circuit). The IC including the part or the whole of the peripheral driver circuit may be mounted over the substrate 111 by a COG (Chip On Glass) method, a COF (Chip on Film) method, or the like. The IC may be mounted on the FPC 124 by a COF method or the like.

A signal and power are input from the outside to the display region 235, the peripheral circuit region 232, and the peripheral circuit region 233 through the FPC 124.

FIG. 1A also illustrates an enlarged view of part of the display region 235. In the display region 235, a plurality of pixels 240 are arranged in a matrix. The pixel 240 includes a pixel 230R, a pixel 230G, and a pixel 230B. Note that in this specification and the like, in the case where matters common to the pixel 230R, the pixel 230G, and the pixel 230B are described or in the case where these three pixels need not be distinguished from each other, they are simply referred to as a "pixel 230" in some cases.

Cross-Sectional Structure Example

FIG. 1B is a cross-sectional view of a portion indicated by dashed-dotted line A1-A2 in FIG. 1A. FIG. 1B illustrates cross sections of part of the display region 235, part of the peripheral circuit region 233, and part of a region including the FPC 124.

The pixel 230R, the pixel 230G, and the pixel 230B each include a light-emitting element 170 as a display element. The light-emitting element 170 includes an electrode 171 functioning as an anode, an EL layer 172, and an electrode 173 functioning as a cathode.

In addition, the pixel 230R, the pixel 230G, and the pixel 230B each include a transistor 251 for driving the display element. The peripheral circuit region 232 and the peripheral circuit region 233 each include a plurality of transistors. FIG. 1B illustrates a transistor 252 as an example of the transistors included in the peripheral circuit region 233.

The display apparatus 100 includes the transistor 251, the transistor 252, the light-emitting element 170, the coloring layer 131 (the coloring layer 131R, the coloring layer 131G, and the coloring layer 131B), a light-blocking layer 132, and the like between the substrate 111 and the substrate 121. The substrate 111 and the substrate 121 are bonded to each other with an adhesive layer 142 therebetween.

As the adhesive layer 142, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

The substrate 121 is provided with an insulating layer 122, the coloring layer 131, the light-blocking layer 132, an insulating layer 133, and the like. The insulating layer 133 may have a function of a planarization layer. Note that a "planarization layer" refers to a layer including a surface serving as a formation surface with reduced unevenness.

FIG. 1C is an enlarged view of the transistor 252. Note that the transistor 251 can have a structure similar to that of the transistor 252.

The transistor 252 includes an electrode 221, a semiconductor layer 231, an electrode **224*a*, an electrode 224*b*, and an electrode 226. The electrode 221 is provided over the insulating layer 113, and an insulating layer 211 is provided to cover the electrode 221. The semiconductor layer 231 is provided over the insulating layer 211. The electrode 224*a* and the electrode 224*b* are provided over the insulating layer 211, the electrode 224*a* includes a region in contact with part of the semiconductor layer 231, and the electrode 224*b* includes a region in contact with another part of the semiconductor layer 231. One of the electrode 224*a* and the electrode 224*b* can function as a source electrode. The other of the electrode 224*a* and the electrode 224*b*** can function as a drain electrode.

An insulating layer 210 is provided to cover the electrode **224*a*, the electrode 224*b*, and the semiconductor layer 231. The electrode 226 is provided over the insulating layer 210. The electrode 226 includes a region overlapping with the semiconductor layer 231. An insulating layer 213 is provided to cover the electrode 226**.

FIG. 1B illustrates bottom-gate transistors as the transistor 251 and the transistor 252. The transistor 251 is a transistor controlling current flowing to the light-emitting element 170 (such a transistor is also referred to as a driving transistor).

An insulating layer 114 is provided over the insulating layer 213. The insulating layer 114 has a function of a planarization layer. The transistor 251 and the transistor 252 are covered with the insulating layer 213 and the insulating layer 114. The number of insulating layers covering the transistors is not limited, and may be one or two or more.

A material through which impurities such as water and hydrogen do not easily diffuse is preferably used for at least one of the insulating layers covering the transistors. Thus, such an insulating layer can serve as a barrier film. Such a structure can effectively inhibit diffusion of the impurities into the transistors from the outside, thereby achieving a highly reliable display apparatus.

In the pixel 230, the electrode 171 is provided over the insulating layer 114. The electrode 171 is electrically connected to one of a source and a drain of the transistor 251 through an opening portion provided in the insulating layer 114.

The EL layer 172 is provided over the electrode 171, and the electrode 173 is provided over the EL layer 172. The electrode 173 includes a region overlapping with the electrode 171 with the EL layer 172 therebetween.

The light-emitting element 170 is covered with an insulating layer 115 and an insulating layer 116. The insulating layer 116 has a function of a planarization layer.

A conductive layer 118 is provided over the insulating layer 116. The conductive layer 118 is electrically connected to the electrode 173 through an electrode 117 provided to be embedded in the insulating layer 115 and the insulating layer 116. The conductive layer 118 is electrically connected to a plurality of electrodes 173 and functions as a common electrode.

In the display apparatus 100 illustrated in FIG. 1B, a wiring 125, an electrode 228, and an electrode 229 are provided. The wiring 125 and the electrode 228 are provided over the insulating layer 211. The electrode 229 is electrically connected to the electrode 228 through an opening portion that is provided in the insulating layer 210 and overlaps with the electrode 228. The wiring 125 and the electrode 228 can be formed concurrently with the electrode 224*a* and the electrode 224*b* in the same step. The electrode 229 can be formed concurrently with the electrode 226 in the same step.

The FPC 124 is electrically connected to the electrode 229 through a connection layer 138. The electrode 229 is electrically connected to the peripheral driver circuit.

As the connection layer 138, an anisotropic conductive film (ACF), an anisotropic conductive paste (ACP), or the like can be used.

The light-emitting element 170 is a top-emission light-emitting element, for example. The light-emitting element 170 has a stacked-layer structure in which the electrode 171 functioning as an anode, the EL layer 172, and the electrode 173 functioning as a cathode are stacked in this order from the insulating layer 114 side.

In the case where the light-emitting element 170 is a top-emission light-emitting element, the electrode 171 has a function of reflecting visible light and the electrode 173 has a function of transmitting visible light. In addition, the conductive layer 118 also has a function of transmitting visible light.

The EL layer 172 includes at least a light-emitting layer. As layers other than the light-emitting layer, the EL layer 172 may further include layers containing a substance with a high hole-injection property, a substance with a high hole-transport property, a hole-blocking material, a substance with a high electron-injection property, a substance with a high electron-transport property, an electron-blocking material, a substance with a bipolar property (a substance with a high electron-transport property and a high hole-transport property), and the like.

The emission color of the light-emitting element 170 can be white, red, green, blue, cyan, magenta, yellow, or the like depending on the material contained in the EL layer 172.

Examples of a method for achieving color display include a method in which the light-emitting element 170 whose emission color is white is combined with a coloring layer and a method in which the light-emitting element 170 with a different emission color is provided in each pixel. The former method is more productive than the latter method. In contrast, the latter method, which requires separate formation of the EL layer 172 pixel by pixel, is less productive than the former method. However, the latter method can provide higher color purity of the emission color than the former method. In the latter method, the color purity can be further increased when the light-emitting element 170 has a microcavity structure.

Either a low molecular compound or a high molecular compound can be used for the EL layer 172, and an inorganic compound may also be contained. The layers included in the EL layer 172 can each be formed by a method such as an evaporation method (including a vacuum evaporation method), a transfer method, a printing method, an inkjet method, a coating method, or the like.

The EL layer 172 may contain an inorganic compound such as quantum dots. For example, when used for the light-emitting layer, the quantum dots can function as a light-emitting material.

In this embodiment, the light-emitting element 170 whose emission color is white is used. Light 175 emitted by the light-emitting element 170 is emitted to the substrate 121 side through the coloring layer 131. The wavelength range of the light 175 passing through the coloring layer 131 changes depending on the material contained in the coloring layer 131. That is, the hue of the light 175 can be changed to red, green, blue, cyan, magenta, yellow, or the like by making the light 175 pass through the coloring layer 131.

In this embodiment, light 175R whose hue is changed after the light 175 passes through the coloring layer 131R is emitted from the pixel 230R. In addition, light 175G whose hue is changed after the light 175 passes through the coloring layer 131G is emitted from the pixel 230G. In addition, light 175B whose hue is changed after the light 175 passes through the coloring layer 131B is emitted from the pixel 230B.

Color display can be achieved when the hue of light to be controlled varies between pixels. To achieve color display, the colors of the coloring layers combined with the emission color of the light-emitting element 170 may be a combination of yellow, cyan, and magenta, as well as a combination of red, green, and blue. The combination of the colors of the coloring layers may be set as appropriate in accordance with the purpose, the uses, or the like.

[Substrate]

There is no particular limitation on a material used for the substrate 111 and the substrate 121. The material is determined in accordance with the purpose in consideration of whether it has a light-transmitting property, heat resistance high enough to withstand heat treatment, or the like. For example, a glass substrate of barium borosilicate glass, aluminosilicate glass, or the like; a ceramic substrate; a quartz substrate; a sapphire substrate; or the like can be used. Alternatively, a semiconductor substrate, a flexible substrate, an attachment film, a base film, or the like may be used.

Examples of the semiconductor substrate include a semiconductor substrate using silicon, germanium, or the like as a material and a compound semiconductor substrate using silicon carbide, silicon germanium, gallium arsenide, indium phosphide, zinc oxide, or gallium oxide as a material. For the semiconductor substrate, a single-crystal semiconductor or a polycrystalline semiconductor may be used.

In order to increase the flexibility of the display apparatus 100, a flexible substrate, an attachment film, a base film, or the like may be used as the substrate 111 and the substrate 121.

As the materials of the flexible substrate, the attachment film, the base film, and the like, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used.

When the above-described material is used for the substrate, a lightweight display apparatus can be provided. Furthermore, when the above-described material is used for the substrate, a shock-resistant display apparatus can be provided. Moreover, when the above-described material is used for the substrate, a display apparatus that is less likely to be broken can be provided.

The flexible substrate used as the substrate 111 and the substrate 121 preferably has a lower coefficient of linear expansion because deformation due to an environment is inhibited. For the flexible substrate used as the substrate 111 and the substrate 121, for example, a material whose coefficient of linear expansion is lower than or equal to $1\times10^{-3}$/K, lower than or equal to $5\times10^{-5}$/K, or lower than or equal to $1\times10^{-5}$/K is used. In particular, aramid is suitable for the flexible substrate because of its low coefficient of linear expansion.

[Conductive Layer]

As a conductive material that can be used for the gate, the source, and the drain of the transistor and conductive layers such as various wirings and electrodes included in the display apparatus, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing the above metal element as a component; an alloy containing the above metal elements in combination; or the like can be used. Alternatively, a semiconductor typified by polycrystalline silicon containing an impurity element such as phosphorus, or silicide such as nickel silicide may be used. There is no particular limitation on the formation method of the conductive material, and a variety of formation methods such as an evaporation method, a CVD method, a sputtering method, and a spin coating method can be employed.

As the conductive material that can be used for the conductive layer, a conductive material containing oxygen, such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added, can be used. Moreover, a conductive material containing nitrogen, such as titanium nitride, tantalum nitride, or tungsten nitride, can be used. In addition, a stacked-layer structure in which a conductive material containing oxygen, a conductive material containing nitrogen, and a material containing the above-described metal element are combined as appropriate can be used.

The conductive material that can be used for the conductive layer may have a single-layer structure or a stacked-layer structure of two or more layers. For example, the conductive layer may have a single layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, or a three-layer structure including a titanium layer, an aluminum layer stacked over the titanium layer, and a titanium layer formed thereover. Alternatively, an aluminum alloy containing one or more elements selected from titanium, tantalum, tungsten, molybdenum, chromium, neodymium, and scandium may be used as the conductive material.

In the case where the light-emitting element 170 is a top-emission light-emitting element, the electrode 171 is preferably formed using a conductive material that effectively reflects light emitted by the EL layer 172. Note that the electrode 171 may have a stacked-layer structure of a plurality of layers without limitation to a single-layer structure. For example, in the case where the electrode 171 is used as an anode, a layer in contact with the EL layer 172 may be a light-transmitting layer, such as an indium tin oxide layer, and a layer having high reflectance (e.g., aluminum, an alloy containing aluminum, or silver) may be provided in contact with the layer.

As the conductive material that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the above metal material and/or alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, a metal film or an alloy film may be stacked with a metal oxide film. For example, when a metal film or a metal oxide film is stacked to be in contact with an aluminum alloy film, oxidation of the aluminum alloy film can be inhibited. Other examples of the metal film or the metal oxide film are titanium and titanium oxide. Alternatively, as described above, the light-transmitting conductive film and a film containing a metal material may be stacked. For example, a stacked-layer film of silver and indium tin oxide or a stacked-layer film of an alloy of silver and magnesium and indium tin oxide (ITO) can be used.

In the case where the light-emitting element 170 is a light-emitting element having a bottom-emission structure, a conductive material transmitting visible light is used for the electrode 171 and a conductive material reflecting visible light is used for the electrode 173. In the case of a display apparatus in which the light-emitting element 170 has a dual-emission structure, a conductive material transmitting visible light is used for both the electrode 171 and the electrode 173.

As a conductive material with a light-transmitting property, a conductive oxide such as indium oxide, indium tin oxide, indium zinc oxide, zinc oxide, or zinc oxide to which gallium is added, or graphene can be used. Alternatively, as a conductive material with a light-transmitting property, an oxide conductor can be used. Alternatively, a metal material such as gold, silver, platinum, magnesium, nickel, tungsten, chromium, molybdenum, iron, cobalt, copper, palladium, or titanium, or an alloy material containing the metal material can be used. Alternatively, a nitride of the metal material (e.g., titanium nitride) or the like may be used. Note that in the case of using the metal material or the alloy material (or the nitride thereof), the thickness is set small enough to have a light-transmitting property. A stacked-layer film of any of the above materials can be used as a conductive layer. For example, a stacked-layer film of indium tin oxide and an alloy of silver and magnesium, or the like is preferably used for increased conductivity. They can also be used for conductive layers such as a variety of wirings and electrodes that constitute the display apparatus, and conductive layers (conductive layers functioning as a pixel electrode or a common electrode) included in the display element.

Here, an oxide conductor, which is one kind of metal oxide, is described. In this specification and the like, an oxide conductor may be referred to as OC (Oxide Conductor). For example, oxygen vacancies are formed in a metal oxide, and then hydrogen is added to the oxygen vacancies, so that a donor level is formed in the vicinity of the conduction band. As a result, the conductivity of the metal oxide is increased, so that the metal oxide becomes a conductor. The metal oxide having become a conductor can be referred to as an oxide conductor. Oxide semiconductors generally have a visible-light-transmitting property because of their large energy gap. Meanwhile, an oxide conductor is a metal oxide having a donor level in the vicinity of the conduction band. Therefore, the influence of absorption due to the donor level is small in the oxide conductor, and the oxide conductor has a visible-light-transmitting property comparable to that of an oxide semiconductor.

[Insulating Layer]

For each of the insulating layers, a single layer or a stack layer of materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. A material in which a plurality of materials selected from an oxide material, a nitride material, an oxynitride material, and a nitride oxide material are mixed may be used.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

It is particularly preferable that the insulating layer 113 and the insulating layer 213 be formed using an insulating material through which impurities are less likely to pass. For example, a single layer or a stacked layer of an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Examples of the insulating material through which impurities are less likely to pass include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material through which impurities are less likely to pass is used for the insulating layer 113, impurity diffusion from the substrate 111 side can be inhibited, and the reliability of the transistor can be improved. When the insulating material through which impurities are less likely to pass is used for the insulating layer 213, impurity diffusion from the insulating layer 114 side can be inhibited, and the reliability of the transistor can be improved.

The insulating layer that can function as a planarization layer can be formed using an organic material having heat resistance, such as polyimide, an acrylic resin, a benzocyclobutene-based resin, polyamide, or an epoxy resin. Other than the above organic materials, it is also possible to use a low dielectric constant material (a low-k material), a siloxane-based resin, PSG (phosphosilicate glass), BPSG (borophosphosilicate glass), or the like. Note that a plurality of insulating layers formed of these materials may be stacked.

Note that the siloxane-based resin corresponds to a resin including a Si—O—Si bond formed using a siloxane-based material as a starting material. In the siloxane-based resin, an organic group (e.g., an alkyl group or an aryl group), a fluoro group, or the like may be used as a substituent. In addition, the organic group may include a fluoro group.

The surface of the insulating layer or the like may be subjected to chemical mechanical polishing (CMP) treatment (hereinafter also referred to as "CMP treatment"). By the CMP treatment, unevenness of a sample surface can be reduced, and coverage with an insulating layer and a conductive layer to be formed later can be increased.

[Coloring Layer]

Examples of a material that can be used for the coloring layer include a metal material, a resin material, and a resin material containing a pigment or a dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can also be used for the light-blocking layer. For example, a stacked-layer structure of a film containing a material of a coloring layer that transmits light of a certain color and a film containing a material of a coloring layer that transmits light of another color can be used. Material sharing between the coloring layer and the light-blocking layer is preferable because process simplification as well as equipment sharing can be achieved.

[Transistor]

There is no particular limitation on the structure of the transistor included in the display apparatus of one embodiment of the present invention. For example, a planar transistor may be used, or a staggered transistor may be used. Alternatively, the transistor structure may be either a top-gate structure or a bottom-gate structure. Gate electrodes may be provided above and below a channel.

A transistor included in a peripheral driver circuit and a transistor included in a pixel circuit may have the same structure or different structures. All the transistors included in the peripheral driver circuit may have the same structure or may use the combination of two or more kinds of structures. Similarly, all the transistors included in the pixel circuit may have the same structure or may use the combination of two or more kinds of structures.

Note that when one of the gate electrodes provided above and below a channel is referred to as a "gate electrode", the other is referred to as a "back gate electrode". In addition, when one of the gate electrodes provided above and below a channel is referred to as a "gate", the other is referred to as a "back gate". Note that the gate electrode may be referred to as a "front gate electrode". Similarly, the gate may be referred to as a "front gate".

For example, the electrode 221 included in the transistor 252 can function as a gate electrode. The electrode 226 included in the transistor 252 can function as a back gate electrode. Thus, the insulating layer 210 and the insulating layer 211 can each function as a gate insulating layer.

When the gate electrode and the back gate electrode are provided, a semiconductor layer of the transistor can be electrically surrounded by an electric field generated from the gate electrode and an electric field generated from the back gate electrode. The transistor structure in which the semiconductor layer where the channel is formed is electrically surrounded by electric fields generated from the gate electrode and the back gate electrode in this manner can be referred to as a Surrounded channel (S-channel) structure.

Thus, the back gate electrode can function in a manner similar to that of the gate electrode. The potential of the back gate electrode may be the same as the potential of the gate electrode or may be a ground potential or a given potential. In addition, when the potential of the back gate electrode is changed not in synchronization with but independently of the potential of the gate electrode, the threshold voltage of the transistor can be changed.

Providing the gate electrode and the back gate electrode and setting the potentials of the gate electrodes to be the same, a region of the semiconductor layer through which carriers flow is enlarged in the film thickness direction; thus, the amount of carrier transfer is increased. As a result, the on-state current of the transistor is increased and the field-effect mobility is increased.

Thus, the transistor can be a transistor having a high on-state current for its occupation area. That is, the occupation area of the transistor can be small for required on-state current. Accordingly, a semiconductor device having a high degree of integration can be provided.

The use of the transistor having a high on-state current for a display apparatus can reduce signal delay in wirings and can suppress a decrease in display quality even if the number of wirings is increased when the display apparatus is increased in size or resolution.

In addition, the gate electrode and the back gate electrode are formed using conductive layers and thus each have a function of preventing an electric field generated outside the transistor from affecting the semiconductor layer where the channel is formed (in particular, an electric field blocking function against static electricity and the like). Note that when the back gate electrode is formed to be larger than the semiconductor layer and the semiconductor layer is covered with the back gate electrode in the plan view, the electric field blocking function can be enhanced.

Since the gate electrode and the back gate electrode each have a function of blocking an electric field from the outside, charges of charged particles and the like generated above and below the transistor do not influence the channel formation region in the semiconductor layer. As a result, deterioration due to a stress test (e.g., an NGBT (Negative Gate Bias-Temperature) stress test where a negative voltage is applied to a gate (also referred to as "NBT" or "NBTS")) is inhibited. In addition, the gate electrode and the back gate electrode can block an electric field generated from the drain electrode so that the electric field do not influence the semiconductor layer. Thus, a change in the rising voltage of on-state current due to a change in drain voltage can be inhibited. Note that this effect is significant when a potential is applied to each of the gate electrode and the back gate electrode.

A change in threshold voltage of a transistor including a back gate electrode between before and after a PGBT (Positive Gate Bias-Temperature) stress test where a positive voltage is applied to a gate (also referred to as "PBT" or "PBTS") is smaller than that of a transistor including no back gate.

The BT stress test such as NGBT or PGBT is a kind of accelerated test and can evaluate, in a short time, a change by long-term use (i.e., a change over time) in characteristics of transistors. In particular, the amount of change in threshold voltage of the transistor between before and after the BT stress test is an important indicator when the reliability is examined. The smaller the amount of change in the threshold voltage between before and after the BT stress test is, the higher the reliability of the transistor becomes.

By providing the gate electrode and the back gate electrode and setting their potentials equal to each other, the amount of change in threshold voltage is reduced. Accordingly, variation in electrical characteristics among a plurality of transistors is also reduced.

In the case where light enters from the back gate electrode side, when the back gate electrode is formed using a light-blocking conductive film, the light can be prevented from entering the semiconductor layer from the back gate electrode side. Therefore, photodegradation of the semiconductor layer can be prevented, and degradation in electrical characteristics of the transistor, such as a shift in the threshold voltage, can be prevented.

[Semiconductor Material]

There is no particular limitation on the crystallinity of a semiconductor material used for the semiconductor layer of the transistor. Either an amorphous semiconductor or a semiconductor having crystallinity (a microcrystalline semiconductor, a polycrystalline semiconductor, a single crystal semiconductor, or a semiconductor partly including crystal regions) may be used. The use of a semiconductor having crystallinity is preferable because degradation of the transistor characteristics can be inhibited.

For example, silicon, germanium, or the like can be used as a semiconductor material used for the semiconductor layer of the transistor. Alternatively, a compound semiconductor such as silicon carbide, gallium arsenide, a metal oxide, or a nitride semiconductor, an organic semiconductor, or the like can be used.

For example, polycrystalline silicon (polysilicon), amorphous silicon, or the like can be used as a semiconductor material used for the transistor. Furthermore, an oxide semiconductor, which is a kind of metal oxide, can be used as a semiconductor material used for the transistor.

<Metal Oxide>

Here, a metal oxide that can be used as an oxide semiconductor is described.

The metal oxide that can be used as an oxide semiconductor preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, an element M, and zinc is considered. The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, magnesium, cobalt, and the like. Note that a combination of two or more of the above elements may be used as the element M.

Note that in this specification and the like, a metal oxide containing nitrogen is also collectively referred to as a metal oxide in some cases. A metal oxide containing nitrogen may be called a metal oxynitride.

<Classification of Crystal Structures>

First, the classification of the crystal structures of an oxide semiconductor will be described with reference to FIG. 14A. FIG. 14A is a diagram showing the classification of crystal structures of an oxide semiconductor, typically IGZO (a metal oxide containing In, Ga, and Zn).

As shown in FIG. 14A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous (excluding single crystal and poly crystal). Moreover, the term "Crystal" includes single crystal and poly crystal.

Note that the structures in the thick frame in FIG. 14A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 14B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 14B and obtained by GIXD measurement may be hereinafter simply referred to as an XRD spectrum in this specification. The CAAC-IGZO film in FIG. 14B has a composition in the neighborhood of In:Ga:Zn=4:2:3 [atomic ratio]. The CAAC-IGZO film in FIG. 14B has a thickness of 500 nm.

In FIG. 14(B), the horizontal axis represents 2θ [deg.], and the vertical axis represents Intensity [a.u.]. As shown in FIG. 14B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 14B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 14C shows a diffraction pattern of the CAAC-IGZO film. FIG. 14C shows a diffraction pattern obtained by NBED in which an electron beam is incident in the direction parallel to the substrate. The CAAC-IGZO film in FIG. 14C has a composition in the neighborhood of In:Ga:Zn=4:2:3 [atomic ratio]. In the nanobeam electron diffraction method, electron diffraction is performed with a probe diameter of 1 nm.

As shown in FIG. 14C, a plurality of spots indicating c-axis alignment are observed in the diffraction pattern of the CAAC-IGZO film.

<Structure of Oxide Semiconductor>

Oxide semiconductors might be classified in a manner different from that in FIG. 14A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In an In-M-Zn oxide (the element M is one or more kinds selected from aluminum, gallium, yttrium, and tin), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[A-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<Structure of Oxide Semiconductor>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, a high on-state current (Ion), a high field-effect mobility ($\mu$), and favorable switching operation can be achieved.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used for a channel formation region of the transistor. For example, the carrier concentration in an oxide semiconductor in the channel formation region is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region of the oxide semiconductor and the concentration of silicon or carbon in the vicinity of an interface with the channel formation region of the oxide semiconductor (the concentrations obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the channel formation region of the oxide semiconductor that is obtained by SIMS is set lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region of the oxide semiconductor that is obtained by SIMS is set lower than $5\times10^{19}$ atoms/$cm^3$, preferably set lower than or equal to $5\times10^{18}$ atoms/$cm^3$, further preferably lower than or equal to $1\times10^{18}$ atoms/$cm^3$, and still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. For this reason, hydrogen in the channel formation region of the oxide semiconductor is preferably reduced as much as possible. Specifically, the hydrogen concentration in the channel formation region of the oxide semiconductor that is obtained by SIMS is set lower than $1\times10^{20}$ atoms/$cm^3$, preferably lower than $5\times10^{19}$ atoms/$cm^3$, further preferably lower than $1\times10^{19}$ atoms/$cm^3$, still further preferably lower than $5\times10^{18}$ atoms/$cm^3$, and yet still further preferably lower than $1\times10^{18}$ atoms/$cm^3$.

When an oxide semiconductor with sufficiently reduced impurities is used for a channel formation region of a transistor, stable electrical characteristics can be given.

<Other Semiconductor Materials>

A semiconductor material that can be used for a semiconductor layer of a transistor is not limited to the above metal oxides. A semiconductor material that has a band gap (a semiconductor material that is not a zero-gap semiconductor) may be used for the semiconductor layer. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For a semiconductor layer of a transistor, a transition metal chalcogenide functioning as a semiconductor is preferably used, for example. Specific examples of the transition metal chalcogenide which can be used for the semiconductor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

<Example of Fabrication Method>

An example of a fabrication method of the display apparatus 100 is described below with reference to drawings. In this embodiment, the display region 235 is focused on in the description of the fabrication method.

Note that the insulating layers, the semiconductor layer, the conductive layers used for forming electrodes and wirings, and the like included in the display apparatus can be formed by a sputtering method, a chemical vapor deposition (CVD) method, a vacuum evaporation method, a pulsed laser deposition (PLD) method, an atomic layer deposition (ALD) method, a plasma ALD (PEALD) method, or the like. As the CVD method, a plasma-enhanced chemical vapor deposition (PECVD) method or a thermal CVD method may be used. As the thermal CVD method, for example, a metal organic chemical vapor deposition (MOCVD: Metal Organic CVD) method may be used.

Alternatively, the insulating layers, the semiconductor layer, the conductive layers used for forming electrodes and wirings, and the like included in the display apparatus may be formed by a method such as spin coating, dipping, spray coating, ink-jetting, dispensing, screen printing, offset printing, slit coating, roll coating, curtain coating, and knife coating.

A PECVD method can provide a high-quality film at a relatively low temperature. With use of a deposition method that does not use plasma at the time of deposition, such as an MOCVD method, an ALD method, or a thermal CVD method, damage is not easily caused on a surface where the film is formed. For example, a wiring, an electrode, an element (a transistor, a capacitor, or the like), or the like included in a semiconductor device might be charged up by receiving charge from plasma. In this case, accumulated charge might break the wiring, the electrode, the element, or the like included in the semiconductor device. By contrast, in the case of a deposition method not using plasma, such plasma damage is not caused; thus, the yield of semiconductor devices can be increased. Moreover, since plasma damage during deposition is not caused, a film with few defects can be obtained.

Unlike a deposition in which particles ejected from a target or the like are deposited, a CVD method and an ALD method are deposition methods in which a film is formed by reaction at a surface of an object to be processed. Thus, the CVD method and the ALD method are deposition methods that enable good step coverage almost regardless of the shape of an object to be processed. In particular, the ALD method enables excellent step coverage and excellent thickness uniformity and thus is suitably used to cover a surface of an opening with a high aspect ratio, for example. Meanwhile, the ALD method has a comparatively low deposition rate, and thus is preferably used in combination with another deposition method with a high deposition rate, such as the CVD method, in some cases.

When a CVD method or an ALD method is used, the composition of a film to be obtained can be controlled with the flow rate ratio of source gases. For example, by the CVD method and the ALD method, a film with a certain composition can be formed depending on the flow rate ratio of the source gases. Moreover, for example, by the CVD method and the ALD method, a film whose composition is continuously changed can be formed by changing the flow rate ratio of the source gases during deposition. In the case of forming a film while changing the flow rate ratio of the source gases, as compared with the case of forming a film with use of a plurality of deposition chambers, the time taken for the deposition can be shortened because the time taken for transfer and pressure adjustment is omitted. Thus, the productivity of the semiconductor device can be increased in some cases.

Note that in the case of forming a film by an ALD method, a gas that does not contain chlorine is preferably used as a material gas.

Furthermore, in the case where an oxide semiconductor is formed by a sputtering method, a chamber of a sputtering apparatus is preferably evacuated to a high vacuum (to the degree of approximately $5\times10^{-7}$ Pa to $1\times10^{-4}$ Pa, for example) by an adsorption vacuum evacuation pump such as a cryopump so that water and the like acting as impurities for the oxide semiconductor film are removed as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa. The deposition temperature is preferably higher than or equal to RT and lower than or equal to 500° C., further preferably higher than or equal to RT and lower than or equal to 300° C., still further preferably higher than or equal to RT and lower than or equal to 200° C.

In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, and still further preferably −120° C. or lower is used, whereby entry of moisture or the like into the oxide semiconductor film can be minimized as much as possible.

In the case where the insulating layers, the conductive layers, the semiconductor layers, or the like are formed by a sputtering method using a sputtering gas containing oxygen, oxygen can be supplied to a layer over which these layers are formed. As the amount of oxygen contained in the sputtering gas increases, the amount of oxygen supplied to the layer over which these layers are formed tends to increase.

When the layers (thin films) that form the display apparatus are processed, a photolithography method or the like can be used for the processing. Alternatively, island-shaped layers may be formed by a deposition method using a blocking mask. Alternatively, a nanoimprinting method, a sandblasting method, a lift-off method, or the like may be used for the processing of the layers. As a photolithography method, a method in which a resist mask is formed over a layer (thin film) to be processed, part of the layer (thin film) is selected and removed by using the resist mask as a mask, and the resist mask is removed, and a method in which a photosensitive layer is formed, and then the layer is exposed to light and developed to be processed into a desired shape are given.

In the case of using light in the photolithography method, an i-line (a wavelength of 365 nm), a g-line (a wavelength of 436 nm), and an h-line (a wavelength of 405 nm), or combined light of them can be used for light exposure. Besides, ultraviolet light, KrF laser light, ArF laser light, or the like can also be used. Exposure may be performed by liquid immersion exposure technique. Furthermore, as the light used for the exposure, extreme ultra-violet (EUV) light, X-rays, or the like may be used. Furthermore, instead of the light used for the exposure, an electron beam can also be used. It is preferable to use extreme ultraviolet light, X-rays, or an electron beam because extremely minute processing can be performed. Note that in the case of performing exposure by scanning of a beam such as an electron beam, a photomask is not needed.

For removal (etching) of the layers (thin films), a dry etching method, a wet etching method, a sandblasting method, or the like can be used. Alternatively, the etching methods may be used in combination.

Figures 8A, 8B:
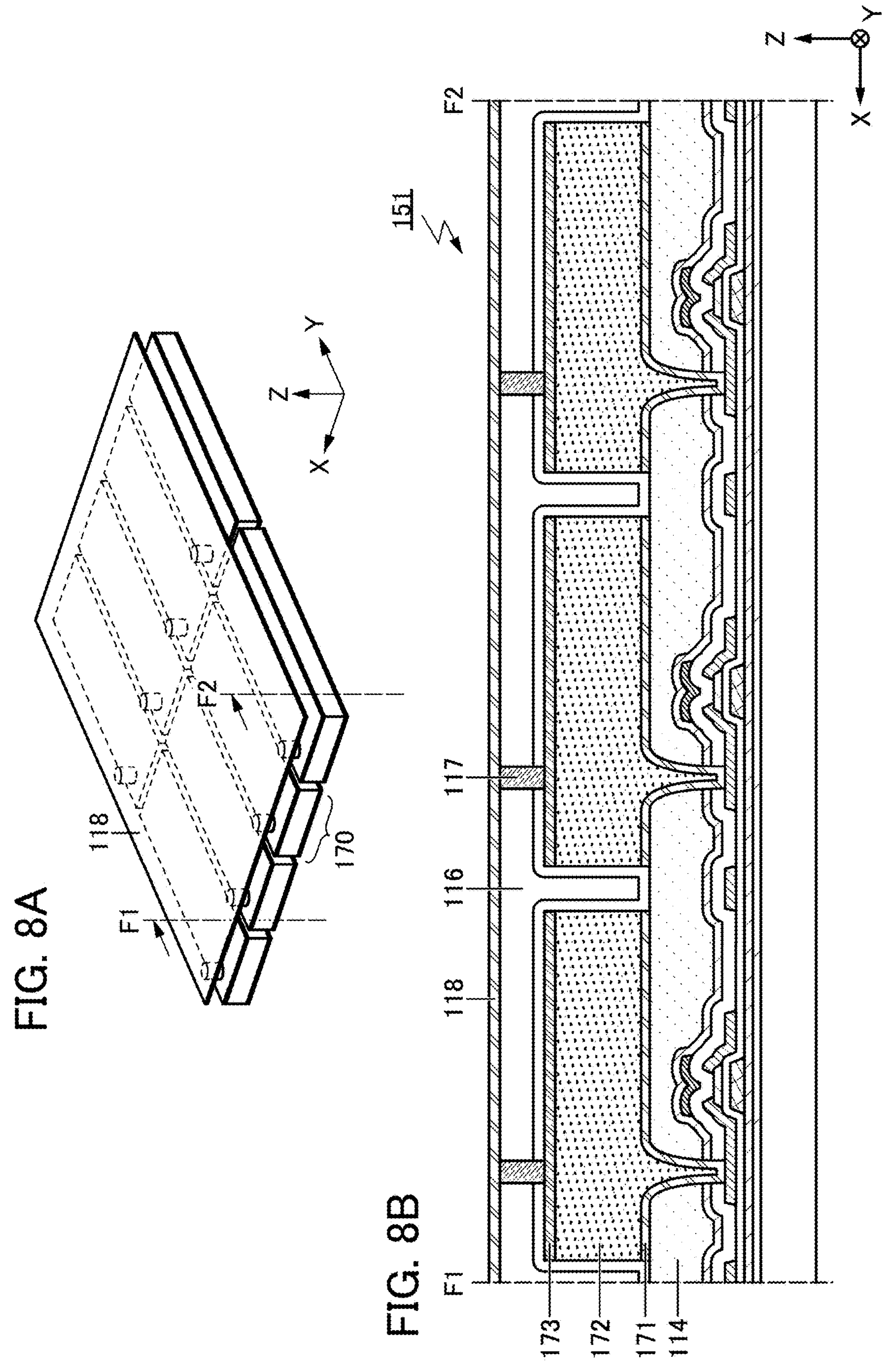
FIG. 8A and FIG. 8B are diagrams illustrating a fabrication method example of the first element substrate.
Figure 11A:
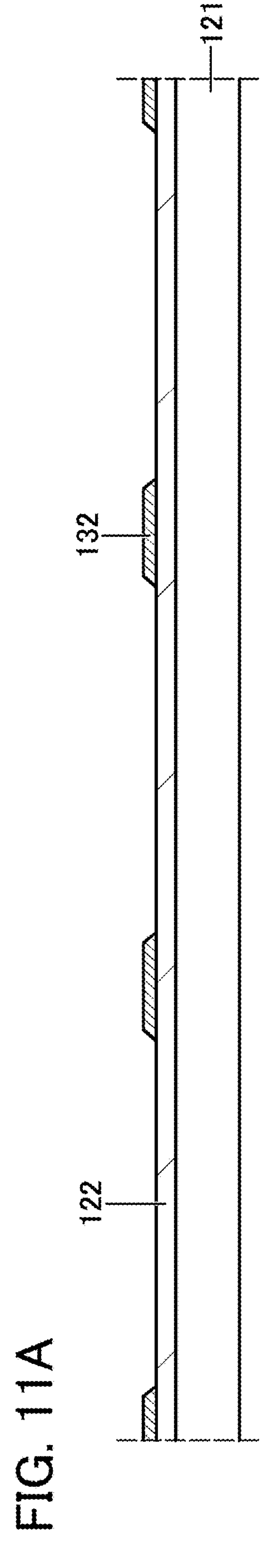
FIG. 11A to FIG. 11C are diagrams illustrating a fabrication method example of a second element substrate.
Figure 11B:
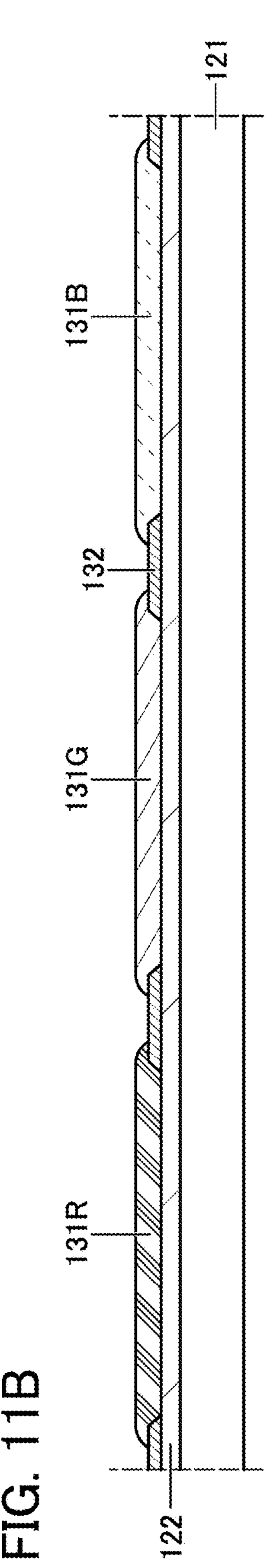
Figure 11C:
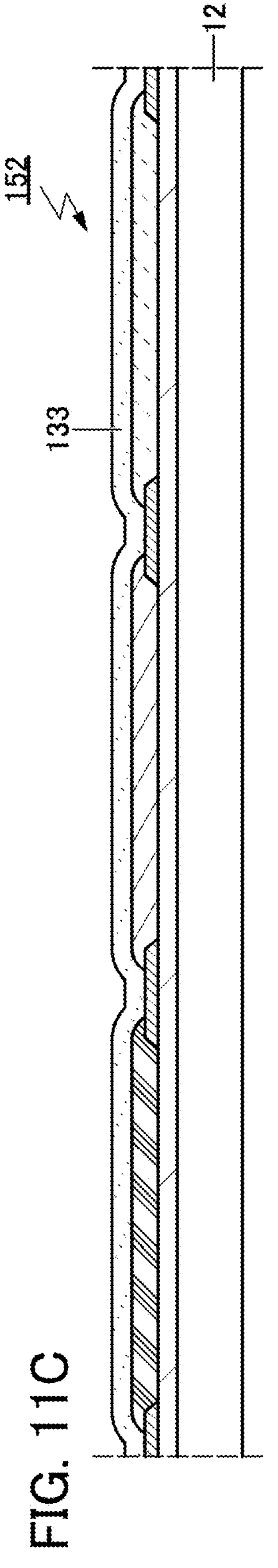

The display apparatus 100 described in this embodiment is fabricated by combining a first element substrate 151 (see FIG. 8(B)) and a second element substrate 152 (see FIG. 11(C)).

[First Element Substrate 151]

First, a method for fabricating the first element substrate 151 is described.

[Step A1]

Figures 2A, 2B, 2C:
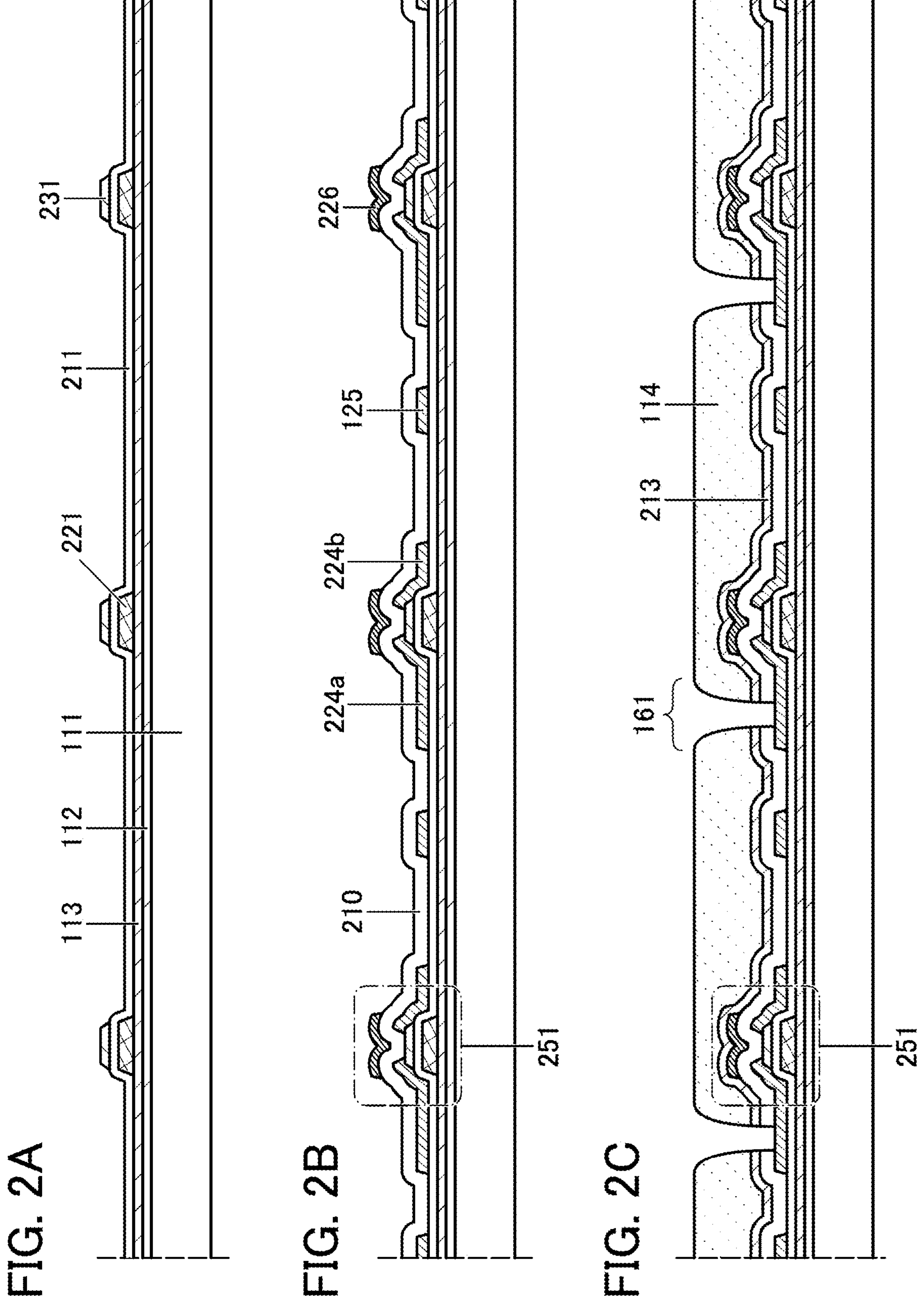
FIG. 2A to FIG. 2C are diagrams illustrating a fabrication method example of a first element substrate.

An insulating layer 112 and an insulating layer 113 are formed over the substrate 111 (see FIG. 2A). A material that is less likely to transmit impurities such as hydrogen and water is preferably used for at least one of the insulating layer 112 and the insulating layer 113.

[Step A2]

Then, the electrode 221 is formed over the insulating layer 113. The electrode 221 can be formed in the following manner: a conductive film is formed, a resist mask is formed, the conductive film is etched, and the resist mask is removed.

[Step A3]

Next, the insulating layer 211 is formed over the insulating layer 113 and the electrode 221. As the insulating layer 211, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

An inorganic insulating film is preferably formed at high temperatures because the film can have higher density and a higher barrier property as the deposition temperature becomes higher. The substrate temperature at the time of depositing the inorganic insulating film is preferably higher than or equal to room temperature (25° C.) and lower than or equal to 350° C., further preferably higher than or equal to 100° C. and lower than or equal to 300° C.

In the case where an oxide semiconductor is used for the semiconductor layer 231, an insulating layer including a region in contact with the semiconductor layer 231 is preferably an insulating layer from which oxygen is released by heating (hereinafter, also referred to as “an insulating layer containing excess oxygen”). Therefore, in the case where an oxide semiconductor is used for the semiconductor layer 231, the insulating layer 211 is preferably the insulating layer containing excess oxygen.

Note that in this specification and the like, oxygen released from a layer by heating is also referred to as “excess oxygen”. In the insulating layer containing excess oxygen, the amount of released oxygen converted into oxygen atoms is sometimes $1.0\times10^{18}$ atoms/cm$^3$ or more, $1.0\times10^{19}$ atoms/cm$^3$ or more, or $1.0\times10^{20}$ atoms/cm$^3$ or more in TDS analysis performed with heat treatment where the surface temperature of the insulating layer is higher than or equal to 100° C. and lower than or equal to 700° C., preferably higher than or equal to 100° C. and lower than or equal to 500° C.

[Step A4]

Next, the semiconductor layer 231 is formed. In this embodiment, an oxide semiconductor layer is formed as the semiconductor layer 231. The oxide semiconductor layer can be formed in the following manner: after an oxide semiconductor film is formed, a resist mask is formed, the oxide semiconductor film is etched, and then the resist mask is removed.

The substrate temperature at the time of forming the oxide semiconductor film is preferably lower than or equal to 350° C., further preferably higher than or equal to room temperature and lower than or equal to 200° C., still further preferably higher than or equal to room temperature and lower than or equal to 130° C.

The oxide semiconductor film can be formed by a sputtering method using one or both of an inert gas and an oxygen gas as a sputtering gas, for example. Note that there is no particular limitation on the flow rate ratio of an oxygen gas (the partial pressure of oxygen) at the time of forming the oxide semiconductor film. However, to obtain a transistor having high field-effect mobility, the flow rate ratio of oxygen (the partial pressure of oxygen) at the time of forming the oxide semiconductor film is preferably higher than or equal to 0% and lower than or equal to 30%, further preferably higher than or equal to 5% and lower than or equal to 30%, still further preferably higher than or equal to 7% and lower than or equal to 15%.

The oxide semiconductor film preferably contains at least indium or zinc. In particular, indium and zinc are preferably contained.

An oxide semiconductor preferably has an energy gap of 2 eV or more, further preferably 2.5 eV or more, still further preferably 3 eV or more. The use of such an oxide semiconductor having a wide energy gap leads to a reduction in off-state current of the transistor.

A semiconductor material having an energy gap of 2.5 eV or more is particularly preferable because of its high visible-light transmittance.

The oxide semiconductor film can be formed by a sputtering method. Alternatively, a PLD method, a PECVD method, a thermal CVD method, an ALD method, or a vacuum evaporation method, for example, may be used.

[Step A5]

Next, the electrode 224*a*, the electrode 224*b*, and the wiring 125 are formed (see FIG. 2B). The electrode 224*a*, the electrode 224*b*, and the wiring 125 can be formed in the following manner: a conductive film is formed, a resist mask is formed, the conductive film is etched, and then the resist mask is removed. Each of the electrode 224*a* and the electrode 224*b* is electrically connected to the semiconductor layer 231.

Note that during the formation of the electrode 224*a* and the electrode 224*b*, part of the semiconductor layer 231 that is not covered by the resist mask might be reduced in thickness by etching.

[Step A6]

Then, the insulating layer 210 is formed. An oxide insulating layer formed in an oxygen-containing atmosphere, such as a silicon oxide layer or a silicon oxynitride layer, is preferably used as the insulating layer 210. Forming the oxide insulating layer in an oxygen-containing atmosphere enables the insulating layer to contain excess oxygen.

[Step A7]

Then, the electrode 226 is formed over the insulating layer 210. The electrode 226 includes a region overlapping with the semiconductor layer 231. In the above manner, the transistor 251 can be formed. Although not illustrated, the transistor 252 is formed in a similar manner.

[Step A8]

Next, the insulating layer 213 is formed (see FIG. 2C). The insulating layer 213 is preferably formed using an insulating material with low oxygen diffusibility and low oxygen permeability, such as silicon nitride.

In the case where the insulating layer 210 is an insulating layer containing excess oxygen, heat treatment is performed with an insulating film with low oxygen diffusibility and low oxygen permeability is stacked thereover, whereby oxygen can be efficiently supplied to the oxide semiconductor layer. As a result, oxygen vacancies in the oxide semiconductor layer can be filled and defects at the interface between the oxide semiconductor layer and the insulating layer 210 can be repaired, leading to a reduction in defect levels. Accordingly, a transistor with extremely high reliability can be obtained. The use of such a transistor in a display apparatus can increase the reliability of the display apparatus.

[Step A9]

Next, the insulating layer 114 is formed. The insulating layer 114 is a layer having a surface where the display element is to be formed later, and thus preferably functions as a planarization layer.

[Step A10]

Next, an opening 161 that reaches the electrode 224*a* is formed in the insulating layer 114, the insulating layer 213, and the insulating layer 210.

[Step A11]

Figures 3A, 3B:
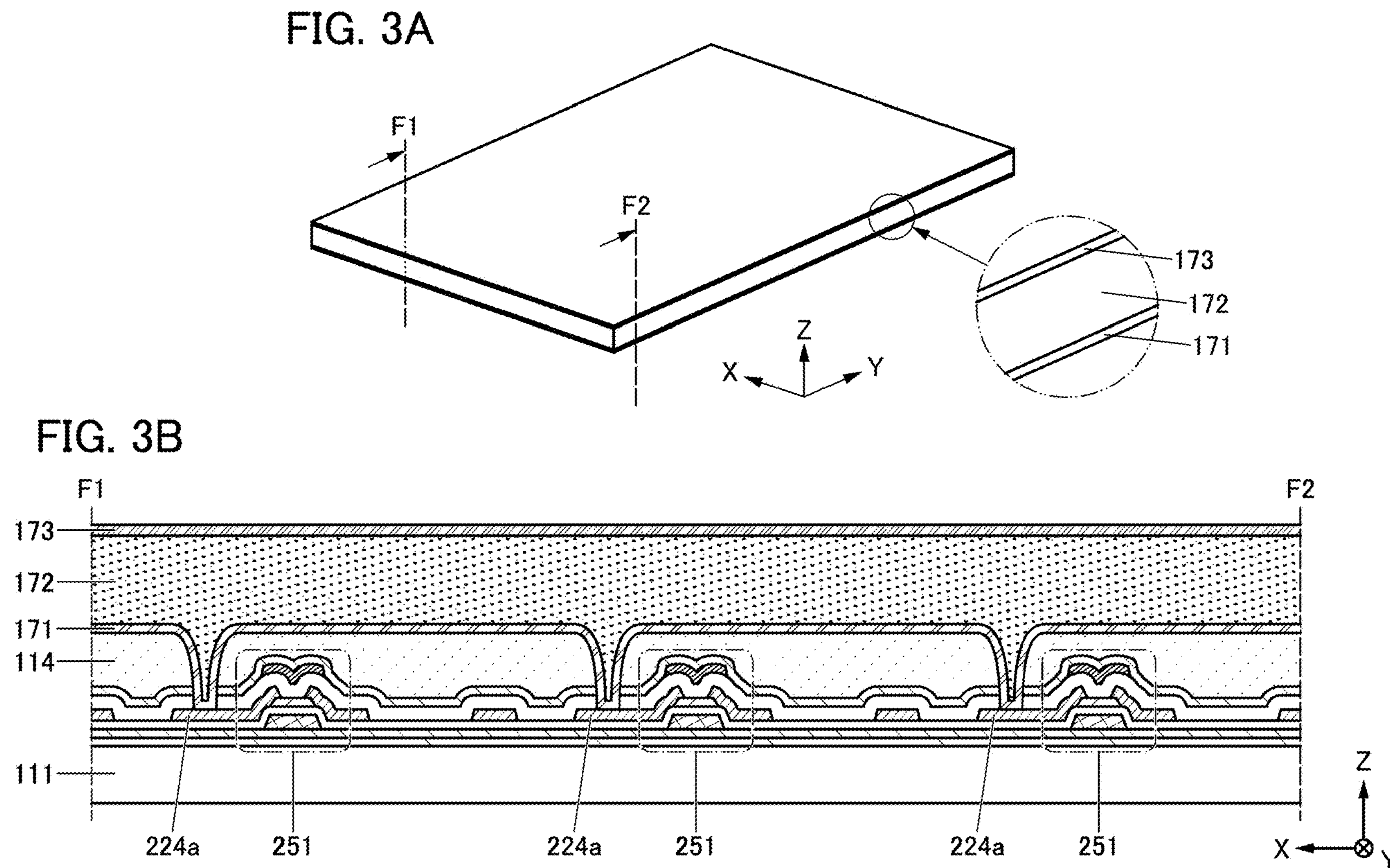
FIG. 3A and FIG. 3B are diagrams illustrating a fabrication method example of the first element substrate.

Next, the electrode 171 is formed over the insulating layer 114 (see FIG. 3A and FIG. 3B). FIG. 3A is a schematic perspective view illustrating a structure body provided above the insulating layer 114. For easy understanding of description disclosed in this embodiment, illustration of some components is omitted in FIG. 3A. For example, illustration of components positioned below the electrode 171 is omitted. The same applies to FIG. 4A, FIG. 5A, FIG. 6A, FIG. 7A1, FIG. 7A2, FIG. 8A, and FIG. 9A that are described later.

In addition, arrows indicating the X direction, the Y direction, and the Z direction are illustrated in drawings and the like. Note that in this specification and the like, "X direction" is a direction along the X axis, and the forward direction and the reverse direction are not distinguished from each other unless otherwise specified. The same applies to "Y direction" and "Z direction". In addition, the X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases. In FIG. 3 or the like, a direction perpendicular to a surface of the substrate 111 is the Z direction.

FIG. 3B is a schematic cross-sectional view illustrating, in the Y direction, the XZ plane overlapping with a portion F1 and a portion F2 that are indicated by dashed-dotted lines in FIG. 3A. The electrode 171 is electrically connected to the electrode 224*a*.

The electrode 171 is formed using a conductive material reflecting visible light. In the case where the electrode 171 is used as an anode, the electrode 171 has a stacked-layer structure of ITO and silver, for example. Alternatively, a stacked-layer structure in which silver is interposed between two ITO films can be employed, for example.

[Step A12]

Then, the EL layer 172 is formed. In this embodiment, the EL layer 172 is formed using an organic EL material. The EL layer 172 can be formed by a method such as an evaporation method, a coating method, a printing method, or a discharge method. Steps performed after the formation of the EL layer 172 are preferably performed such that the temperature applied to the EL layer 172 is lower than or equal to the upper temperature limit of the EL layer 172.

[Step A13]

Next, the electrode 173 is formed. The electrode 173 is formed using a conductive material transmitting visible light. In the case where the electrode 173 is used as a cathode, the electrode 173 has a stacked-layer structure of lithium fluoride and ITO, for example.

[Step A14]

Figures 4A, 4B:
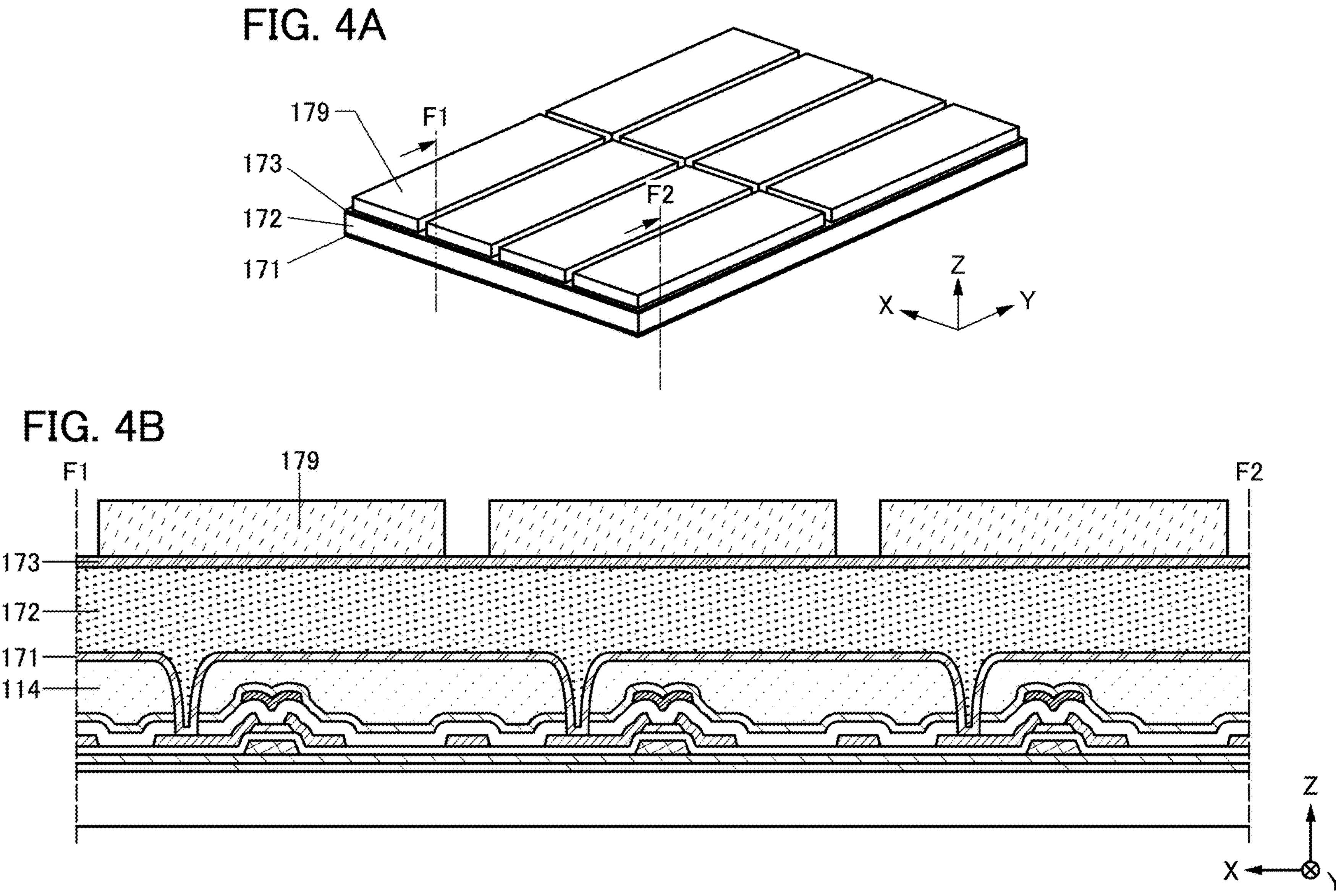
FIG. 4A and FIG. 4B are diagrams illustrating a fabrication method example of the first element substrate.

Next, a resist mask 179 is formed over the electrode 173 (see FIG. 4A and FIG. 4B). FIG. 4A is a schematic perspective view illustrating a state where the resist mask 179 is formed over the electrode 173. FIG. 4B is a schematic cross-sectional view illustrating, in the Y direction, the XZ plane overlapping with the portion F1 and the portion F2 that are indicated by dashed-dotted lines in FIG. 4A.

[Step A15]

Figures 5A, 5B:
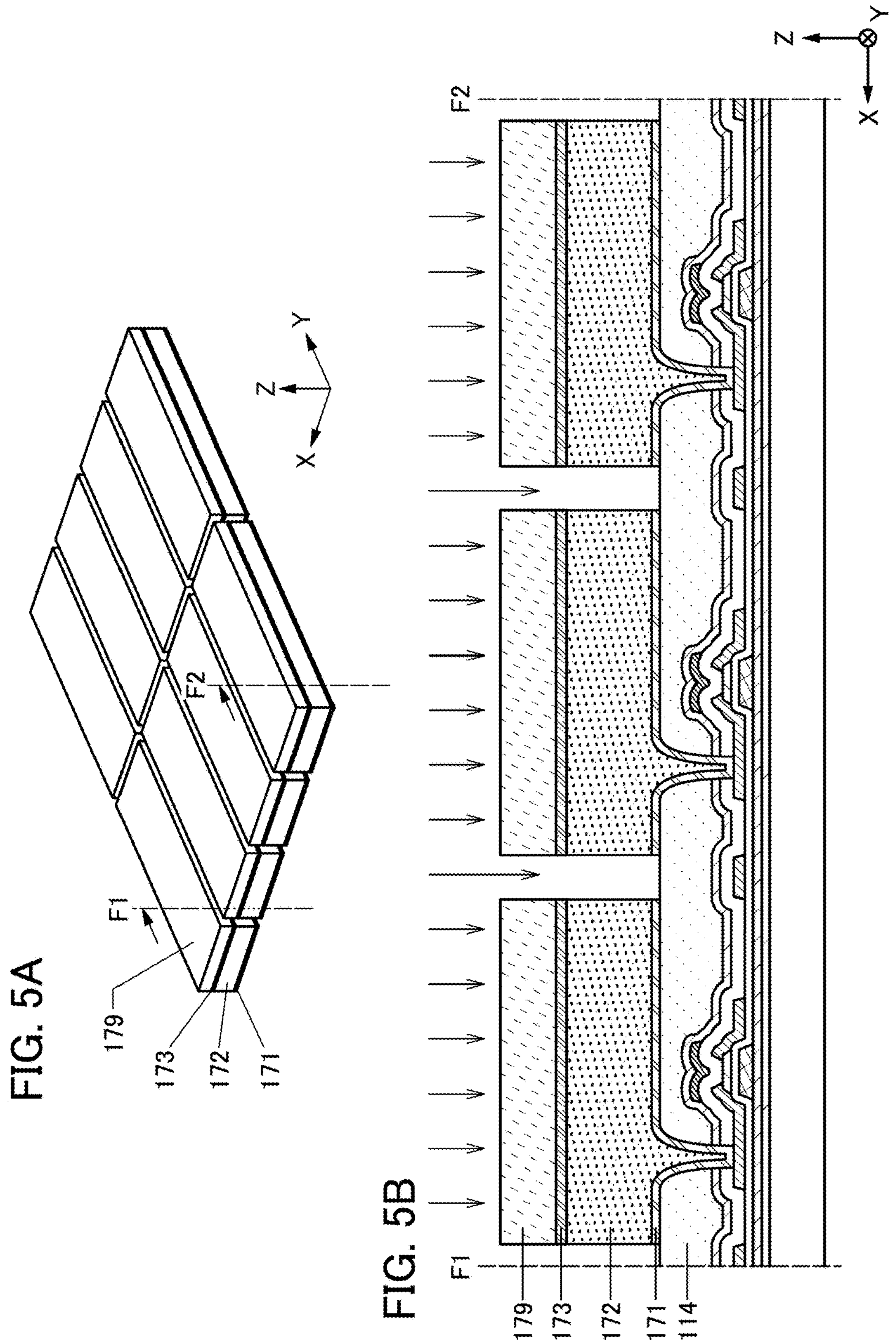
FIG. 5A and FIG. 5B are diagrams illustrating a fabrication method example of the first element substrate.

Next, parts of the electrode 171, the EL layer 172, and the electrode 173 are selectively removed with the use of the resist mask as a mask (see FIG. 5A and FIG. 5B). FIG. 5A is a schematic perspective view illustrating a state where etching treatment is performed. FIG. 5B is a schematic cross-sectional view illustrating, in the Y direction, the XZ plane overlapping with the portion F1 and the portion F2 that are indicated by dashed-dotted lines in FIG. 5A.

For the removal (etching) of the electrode 171, the EL layer 172, and the electrode 173, a dry etching method, a wet etching method, or the like can be used. Alternatively, different etching methods may be used in combination. Etching of the electrode 171, the EL layer 172, and the electrode 173 is preferably performed successively (collectively). Successive etching of the electrode 171, the EL layer 172, and the electrode 173 eliminates the need for formation of a resist mask for each layer, thereby increasing the productivity.

Furthermore, the side surfaces of the electrode 171, the EL layer 172, and the electrode 173 can be substantially aligned with each other depending on the etching conditions. The side surfaces of the electrode 171, the EL layer 172, and the electrode 173 are preferably substantially aligned with each other, in which case the coverage with an insulating film and the like to be formed in a later step can be increased.

[Step A16]

Figures 6A, 6B:
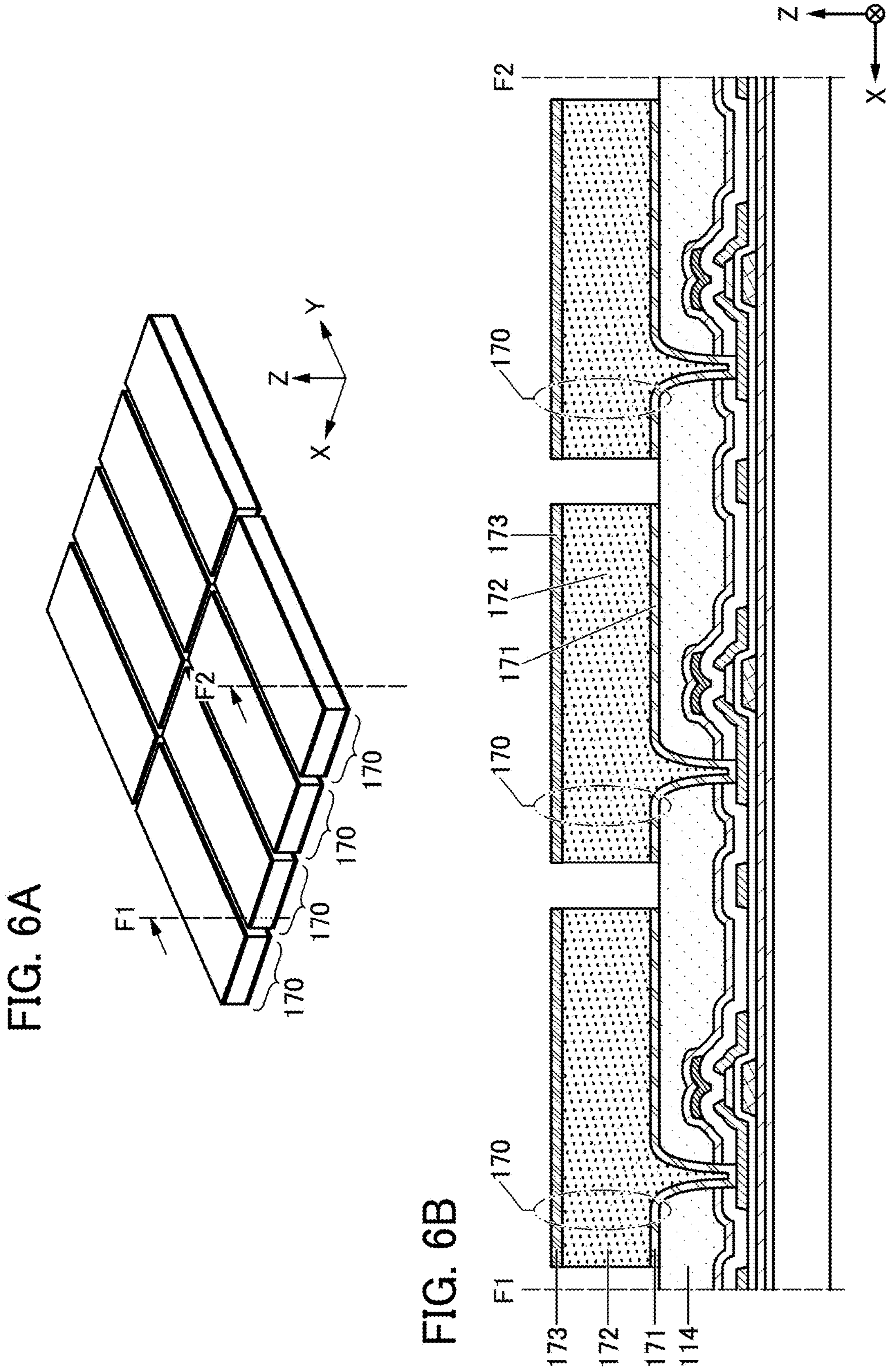
FIG. 6A and FIG. 6B are diagrams illustrating a fabrication method example of the first element substrate.

Next, the resist mask 179 is removed (see FIG. 6A and FIG. 6B). In the above manner, the light-emitting element 170 is formed. FIG. 6A is a schematic perspective view illustrating the light-emitting element 170 formed by etching treatment. FIG. 6B is a schematic cross-sectional view illustrating, in the Y direction, the XZ plane overlapping with the portion F1 and the portion F2 that are indicated by dashed-dotted lines in FIG. 6A.

When the light-emitting element 170 is formed by etching treatment using the resist mask, electric interference between adjacent light-emitting layers can be prevented without use of a partition. Thus, formation of a partition is unnecessary and the productivity of the display apparatus can be increased. Since formation of a partition is unnecessary, an improvement in pixel aperture ratio, an increase in resolution, a reduction in size, and the like can be achieved.

According to one embodiment of the present invention, selective and collective removal of parts of the electrode 171 functioning as an anode, the EL layer 172, and the electrode 173 functioning as a cathode enables separate formation of light-emitting elements functioning as pixels. This allows fabrication of light-emitting elements without use of a metal mask or with use of a smaller number of metal masks, thereby increasing the productivity of the display apparatus.

For example, when the light-emitting element 170 is formed using a metal mask, because of the dimensional accuracy restriction, it is difficult to make an interval (distance) between two adjacent light-emitting elements 170 less than or equal to 20 μm. According to one embodiment of the present invention, the interval between two adjacent light-emitting elements 170 can be less than or equal to 20 μm. Specifically, the interval between two adjacent light-emitting elements 170 can be greater than or equal to 0.5 μm and less than or equal to 15 μm, preferably greater than or equal to 0.5 μm and less than or equal to 10 μm, further preferably greater than or equal to 0.5 μm and less than or equal to 5 μm. Thus, an improvement in pixel aperture ratio, an increase in resolution, a reduction in size, and the like can be achieved.

[Step A17]

Figure 7B:
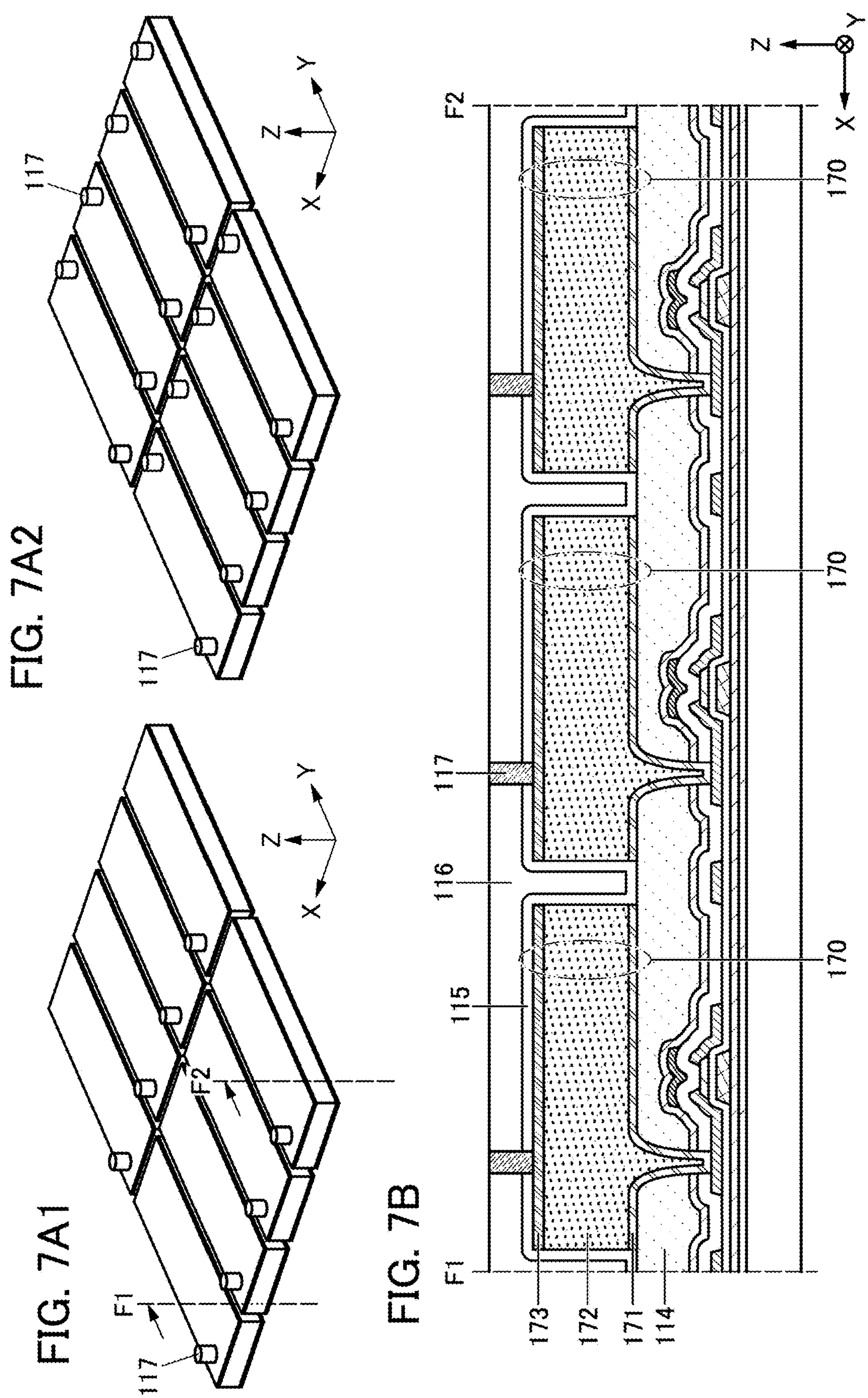

Next, the insulating layer 115 covering the light-emitting element 170 is formed (see FIG. 7B). A material into which impurities such as water and hydrogen are less likely to diffuse is preferably used for the insulating layer 115. Thus, the insulating layer 115 can function as a barrier film. Such a structure can effectively inhibit diffusion of the impurities into the light-emitting elements 170 and the transistors from the outside, and can achieve a highly reliable display apparatus.

As the insulating layer 115, it is possible to use, for example, a stacked-layer structure of an aluminum oxide (AlOx) film and a silicon nitride (SiNy) film over the aluminum oxide film or a stacked-layer structure of an oxide semiconductor (e.g., IGZO) and an aluminum oxide (AlOx) film over the IGZO film. Note the aluminum oxide film, the silicon nitride film, and the oxide semiconductor film can each be formed by an ALD method, a CVD method, or a sputtering method.

Note that FIG. 7A1 and FIG. 7A2 are schematic perspective views each illustrating a state where the electrode 117 to be described later is provided over the light-emitting element 170. FIG. 7B is a schematic cross-sectional view illustrating, in the Y direction, the XZ plane overlapping with the portion F1 and the portion F2 that are indicated by dashed-dotted lines in FIG. 7A1.

[Step A18]

Next, the insulating layer 116 is formed over the insulating layer 115. The insulating layer 116 preferably has a function of a planarization layer.

CMP treatment may be performed on a surface of the insulating layer 116. By the CMP treatment performed on the surface of the insulating layer 116, unevenness of the surface can be reduced, and coverage with an insulating layer and a conductive layer to be formed later can be increased.

[Step A19]

Next, the electrode 117 is formed to be embedded in the insulating layer 115 and the insulating layer 116. The electrode 117 is provided for each light-emitting element 170 and electrically connected to the electrode 173. The number of the electrode 117 provided for each light-emitting element 170 is not limited to one. As illustrated in FIG. 7A2, a plurality of electrodes 117 may be provided in one light-emitting element 170.

[Step A20]

Then, the conductive layer 118 is formed over the insulating layer 116 and the electrode 117 (see FIG. 8A and FIG. 8B). FIG. 8A is a schematic perspective view illustrating a state where the conductive layer 118 is provided over the light-emitting element 170. FIG. 8B is a schematic cross-sectional view illustrating, in the Y direction, the XZ plane overlapping with the portion F1 and the portion F2 that are indicated by dashed-dotted lines in FIG. 8A.

The conductive layer 118 is electrically connected to the electrodes 173 included in the plurality of light-emitting elements 170 and functions as a common electrode. By forming the conductive layer 118 using a conductive material with a light-transmitting property, the light 175 emitted by the light-emitting element 170 can be extracted without being blocked. Accordingly, the conductive layer 118 can be provided to cover the light-emitting elements 170. That is, the conductive layer 118 can be provided to cover the entire display region 235.

In addition, the conductive layer 118 functions as a cathode auxiliary conductive layer. Providing the conductive layer 118 reduces a variation in potential of the cathodes (the electrodes 173) of the entire display region 235 and enables uniform emission intensity to be obtained. Consequently, the display quality of the display apparatus can be improved.

Through the above steps, the first element substrate 151 can be fabricated.

Variation Example 1

Figures 9A, 9B:
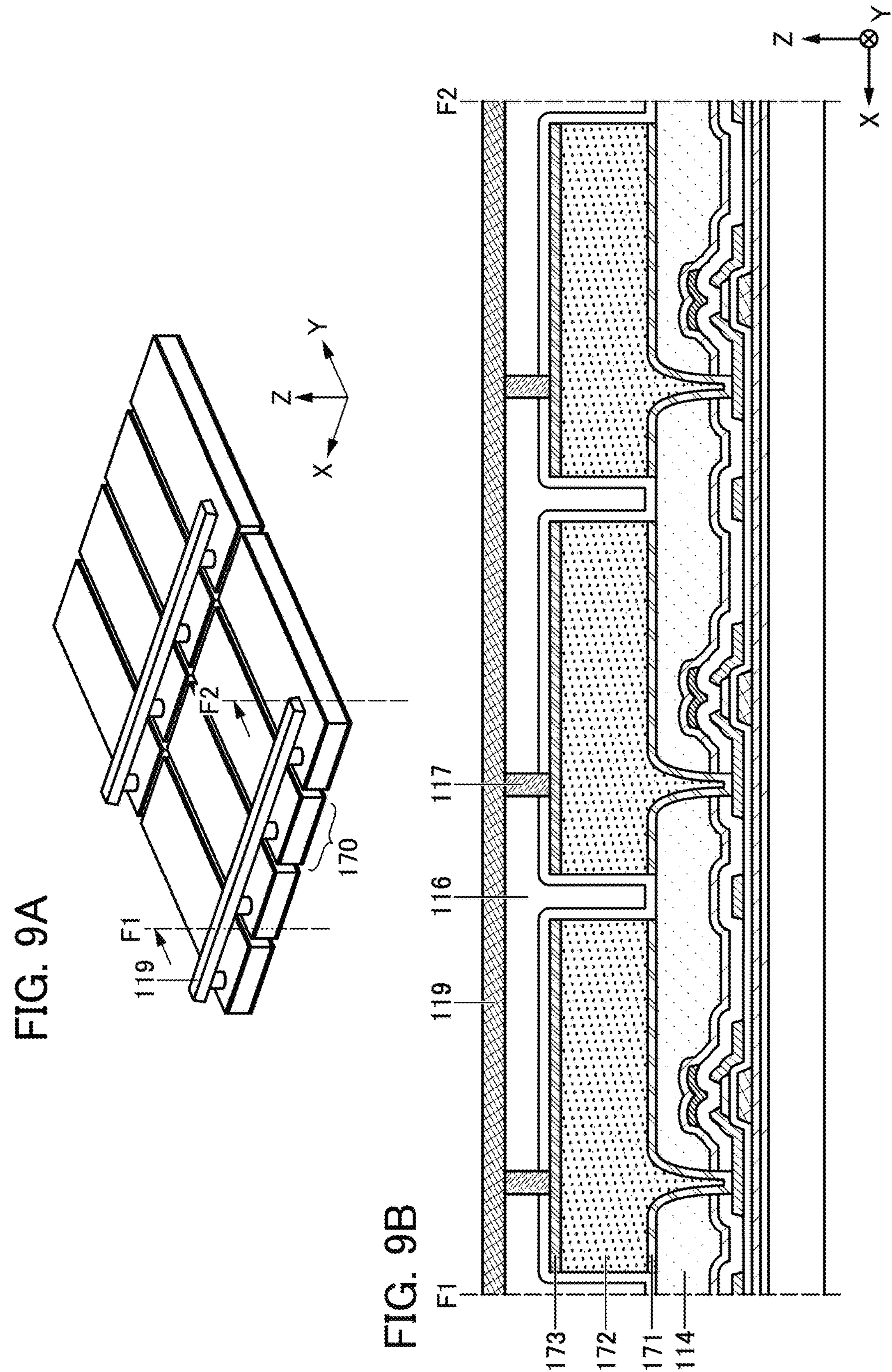
FIG. 9A and FIG. 9B are diagrams illustrating a variation example of the first element substrate.

FIG. 9 illustrates a variation example of the first element substrate 151. In the first element substrate 151, a wiring 119 may be provided instead of the conductive layer 118 over the insulating layer 116 and the electrode 117. FIG. 9A is a schematic perspective view illustrating a state where the wiring 119 is provided over the light-emitting element 170. FIG. 9B is a schematic cross-sectional view illustrating, in the Y direction, the XZ plane overlapping with the portion F1 and the portion F2 that are indicated by dashed-dotted lines in FIG. 9A.

The wiring 119 can be formed using a conductive material with a light-transmitting property or a light-blocking property. In the case where the wiring 119 is formed using a material with a light-blocking property, the wiring 119 is preferably placed so that an area where the wiring 119 overlaps with the light-emitting element 170 is as small as possible. The wiring 119 functions as a cathode auxiliary wiring. When the cathodes of adjacent light-emitting elements are electrically connected to the wiring 119, a variation in potential of the cathodes can be reduced. Consequently, the display quality of the display apparatus can be improved.

The wiring 119 extends in the X direction and is electrically connected to the electrodes 117 that are adjacent to each other in the X direction in FIG. 9; however, the wiring 119 may extend to the Y direction and may be electrically connected to the electrodes 117 that are adjacent to each other in the Y direction. Alternatively, the wirings 119 may be arranged in a net-like shape.

Variation Example 2

Figure 10:
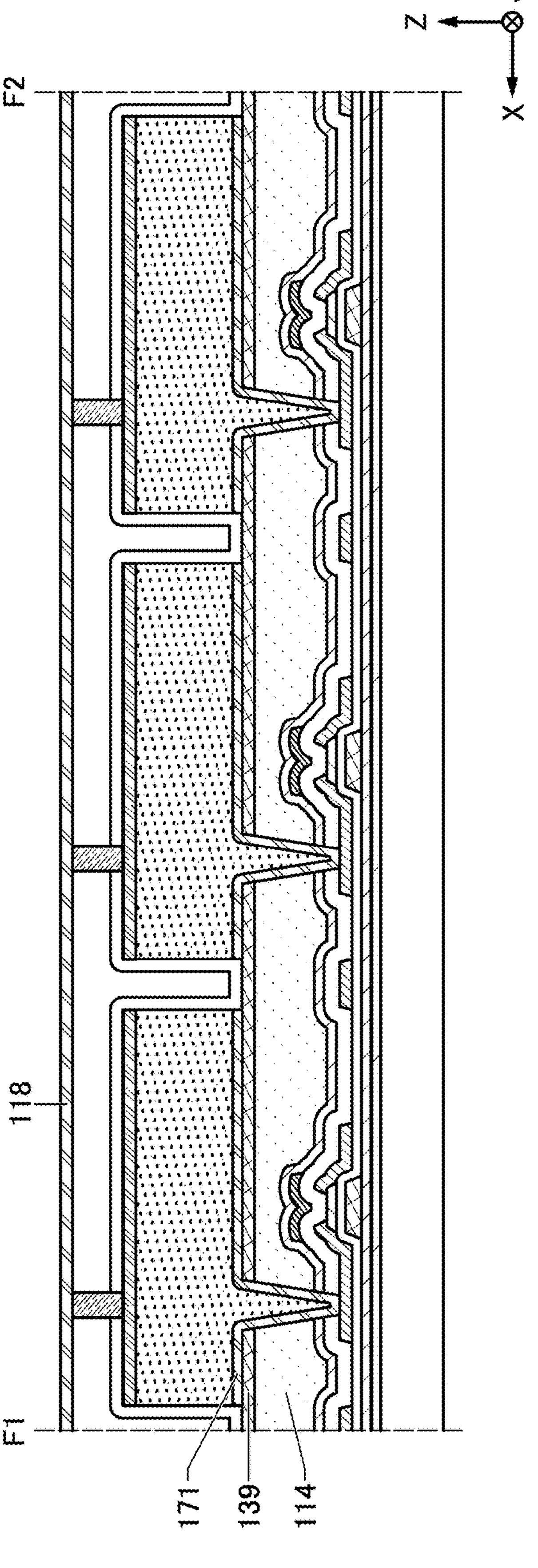
FIG. 10 is a diagram illustrating a variation example of the first element substrate.

As illustrated in FIG. 10, an insulating layer 139 may be provided between the insulating layer 114 and the electrode 171. The insulating layer 139 functions as an etching stopper at the time when parts of the electrode 171 functioning as an anode, the EL layer 172, and the electrode 173 functioning as a cathode are etched in Step A15.

The insulating layer 139 is formed using a material that is less likely to be etched in Step A15. Particularly when Step A15 is performed by a dry etching method or mainly by a dry etching method, the insulating layer 139 is preferably provided. Providing the insulating layer 139 can increase the process design flexibility of Step A15, thereby increasing the productivity and the reliability.

[Second Element Substrate 152]

Next, a method for fabricating the second element substrate 152 is described.

[Step B1]

The insulating layer 122 is formed over the substrate 121 (see FIG. 11A). For the substrate 121, a material similar to that for the substrate 111 can be used.

[Step B2]

Then, the light-blocking layer 132 is formed over the insulating layer 122 (see FIG. 11B).

[Step B3]

Next, the coloring layer 131 is formed over the insulating layer 122 and the light-blocking layer 132.

When formed using a photosensitive material, the coloring layer 131 can be processed into an island shape by a photolithography method or the like. The coloring layer 131 and the light-blocking layer 132 are provided as needed. Thus, at least one of the coloring layer 131 and the light-blocking layer 132 is not provided in some cases. Note that in the display apparatus 100, the light-blocking layer 132 is provided to overlap with the peripheral circuit region 232, the peripheral circuit region 233, and the like.

In this embodiment, the coloring layer 131R transmitting light in a red gamut, the coloring layer 131G transmitting light in a green gamut, and the coloring layer 131B transmitting light in a blue gamut are provided. Note that in the case where the coloring layer 131 and the light-blocking layer 132 are provided, a region where the coloring layer 131 and the light-blocking layer 132 overlap with each other is formed in the periphery of the coloring layer 131.

[Step B4]

Then, the insulating layer 133 is formed over the coloring layer 131 and the light-blocking layer 132 (see FIG. 11C).

The insulating layer 133 preferably functions as a planarization layer. A resin material such as an acrylic resin or an epoxy resin is suitably used for the insulating layer 133. An inorganic insulating layer may be used as the insulating layer 133.

Through the above steps, the second element substrate 152 can be fabricated.

[Display Apparatus 100]

Next, a method for fabricating the display apparatus 100 including the first element substrate 151 and the second element substrate 152 is described.

Figure 12:
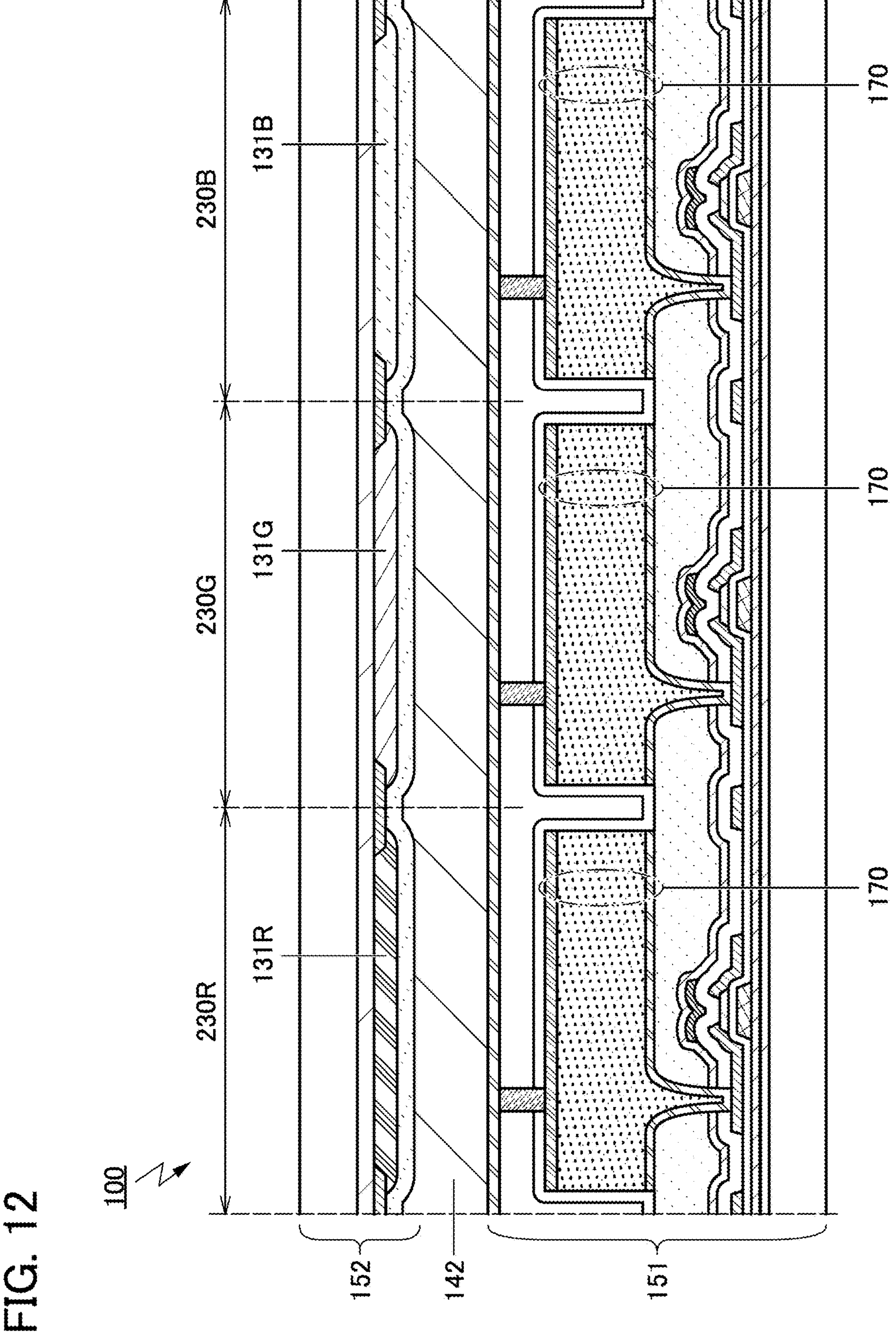
FIG. 12 is a diagram illustrating a fabrication method example of a display apparatus.

The first element substrate 151 and the second element substrate 152 are attached to each other with the adhesive layer 142 interposed therebetween such that the coloring layer 131 faces the light-emitting element 170 (see FIG. 12). At this time, the attachment is performed such that the light-emitting region of the light-emitting element 170 overlaps with the coloring layer 131.

As the adhesive layer 142, a variety of curable adhesives, e.g., a photocurable adhesive such as an ultraviolet curable adhesive, a reactive curable adhesive, a thermosetting adhesive, and an anaerobic adhesive can be used. An adhesive sheet or the like may be used.

Through the above steps, the display apparatus 100 can be fabricated.

Variation Example

Figure 13:
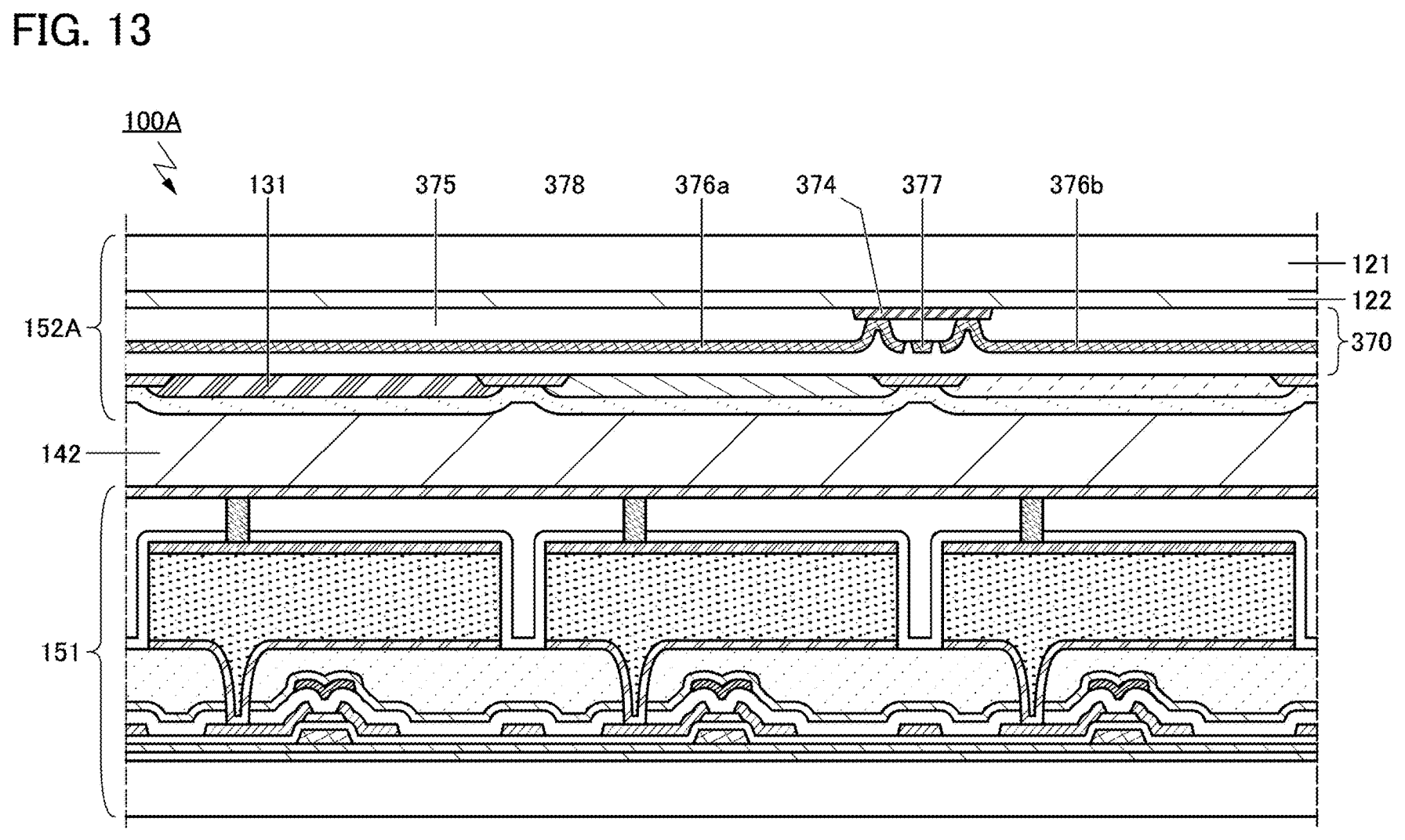

FIG. 13 illustrates a cross section of a display apparatus 100A that is a variation example of the display apparatus 100. The display apparatus 100A includes the first element substrate 151 and a second element substrate 152A. The second element substrate 152A is a variation example of the second element substrate 152, and different from the second element substrate 152 in including a touch sensor 370 between the substrate 121 and the coloring layer 131. In this embodiment, the touch sensor 370 includes a conductive layer 374, an insulating layer 375, a conductive layer 376*a*, a conductive layer 376*b*, a conductive layer 377, and an insulating layer 378.

The conductive layer 376*a*, the conductive layer 376*b*, and the conductive layer 377 are each preferably formed using a conductive material with a light-transmitting property. However, a conductive material with a light-transmitting property generally has resistivity higher than that of a conductive material that does not have a light-transmitting property (a conductive material with a light-blocking property). Thus, the conductive layer 376*a*, the conductive layer 376*b*, and the conductive layer 377 are formed using a metal material having low resistivity in some cases to increase the size and resolution of the touch sensor.

In the case where the conductive layer 376*a*, the conductive layer 376*b*, and the conductive layer 377 are each formed using a metal material, the reflection of external light is preferably reduced. Note that although a metal material is generally a material having a high reflectance, a metal can be darkened by being reduced in reflectance by oxidation treatment or the like.

The conductive layer 376*a*, the conductive layer 376*b*, and the conductive layer 377 may be formed using a stack including a metal layer and a layer having low reflectance (also referred to as a "dark-colored layer"). The dark layer has a high resistance; thus, the stack including the metal layer and the dark-colored layer is preferable. Examples of the dark-colored layer include a layer containing copper oxide and a layer containing copper chloride or tellurium chloride. Alternatively, the dark-colored layer may be formed using a metal particle such as an Ag particle, an Ag fiber, or a Cu particle, a carbon nanoparticle such as a carbon nanotube (CNT) or graphene, a conductive high molecule such as PEDOT, polyaniline, or polypyrrole, or the like.

As the touch sensor 370, an optical touch sensor including a photoelectric conversion element as well as a resistive touch sensor or a capacitive touch sensor may be used. Examples of the capacitive type include a surface capacitive type and a projected capacitive type. Examples of the projected capacitive type include a self-capacitive type and a mutual-capacitive type, which differ mainly in the driving method. The use of a mutual-capacitive touch sensor is preferable because multiple points can be sensed simultaneously.

Note that other components are similar to those of the display apparatus 100 and thus the detailed descriptions thereof are omitted.

The touch sensor may be provided outside the substrate 121. For example, a sheet-like touch sensor may be provided so as to overlap with the display region 235.

The structures described in this embodiment can be used in an appropriate combination with the structures described in the other embodiments and the like.

Embodiment 2

Figure 15A:
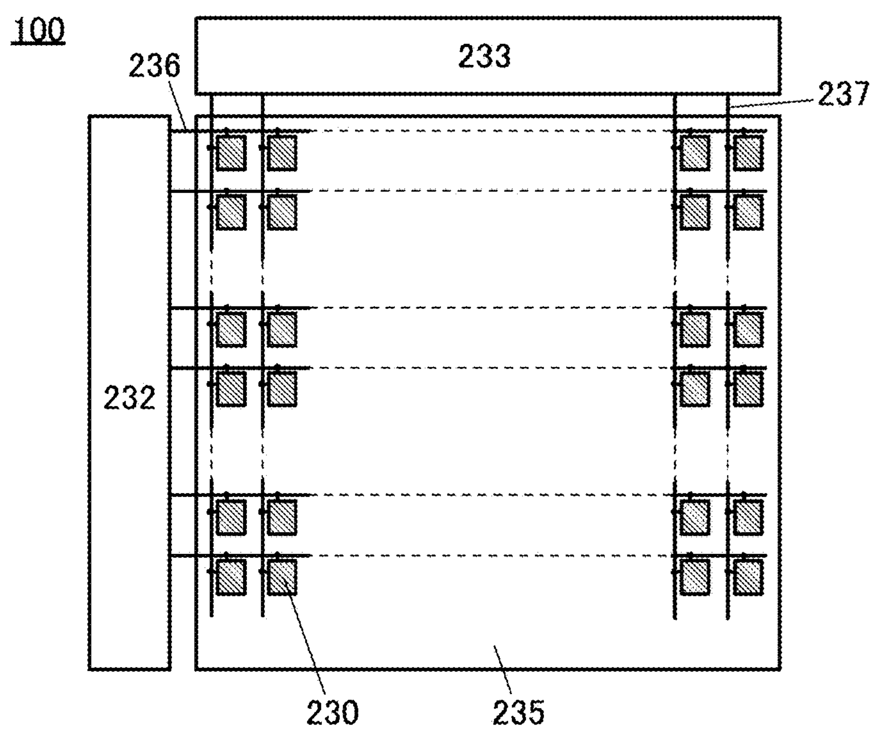
Figure 15A:
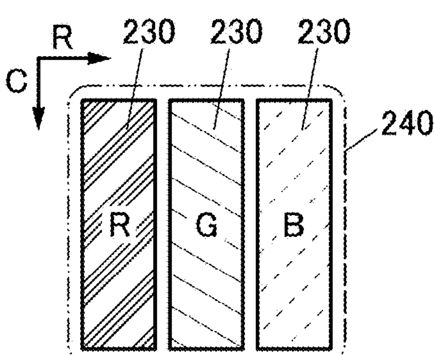
Figure 15A:
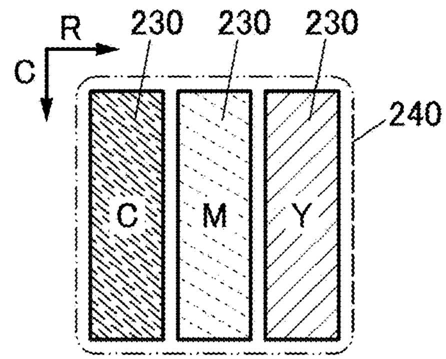
Figure 15A:
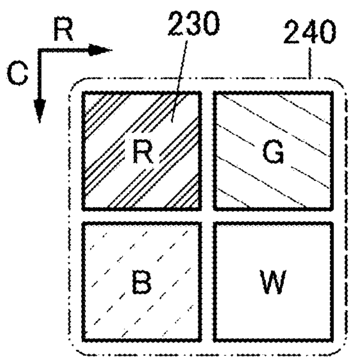
Figure 15A:
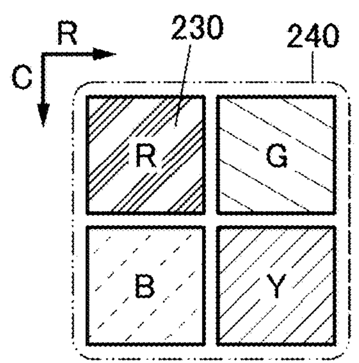
Figure 15A:
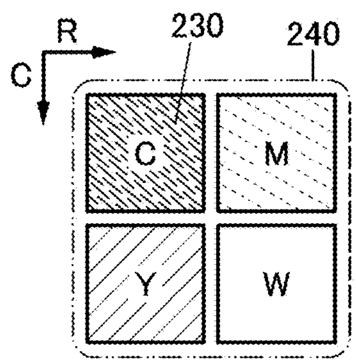

In this embodiment, specific structure examples of the display apparatus 100 of one embodiment of the present invention will be described. FIG. 15A is a block diagram illustrating the display apparatus 100. As described in Embodiment 1, the display apparatus 100 includes the display region 235, the peripheral circuit region 232, and the peripheral circuit region 233.

A circuit included in the peripheral circuit region 232 functions as, for example, a scan line driver circuit. A circuit included in the peripheral circuit region 232 functions as, for example, a signal line driver circuit. Some sort of circuit may be provided at a position facing the peripheral circuit region 232 with the display region 235 interposed therebetween. Some sort of circuit may be provided at a position facing the peripheral circuit region 233 with the display region 235 interposed therebetween. As described above, the circuits included in the peripheral circuit region 232 and the peripheral circuit region 233 are collectively referred to as a "peripheral driver circuit" in some cases.

Any of various circuits such as a shift register, a level shifter, an inverter, a latch, an analog switch, and a logic circuit can be used as the peripheral driver circuit. In the peripheral driver circuit, a transistor, a capacitor, and the like can be used. A transistor included in the peripheral driver circuit can be formed in the same steps as the transistors included in the pixels 230.

The display apparatus 100 includes m wirings 236 (m is an integer of 1 or more) which are arranged substantially parallel to each other and whose potentials are controlled by the circuits included in the peripheral circuit region 232, and n wirings 237 (n is an integer of 1 or more) which are arranged substantially parallel to each other and whose potentials are controlled by the circuits included in the peripheral circuit region 233.

The display region 235 includes a plurality of pixels 230 arranged in a matrix. Full-color display can be achieved by making the pixel 230 that controls red light, the pixel 230 that controls green light, and the pixel 230 that controls blue light collectively function as one pixel 240 and by controlling the amount of light (emission luminance) emitted from each pixel 230. Thus, the three pixels 230 each function as a subpixel. That is, three subpixels control the emission amount or the like of red light, green light, and blue light (see FIG. 15B1). The light colors controlled by the three subpixels are not limited to a combination of red (R), green (G), and blue (B) and may be cyan (C), magenta (M), and yellow (Y) (see FIG. 15B2).

Four subpixels may collectively function as one pixel. For example, a subpixel that controls white light (W) may be added to the three subpixels that control red light, green light, and blue light (see FIG. 15B3). The addition of the subpixel that controls white light can increase the luminance of a display region. Alternatively, a subpixel that controls yellow light may be added to the three subpixels that control red light, green light, and blue light (see FIG. 15B4). Alternatively, a subpixel that controls white light may be added to the three subpixels that control cyan light, magenta light, and yellow light (see FIG. 15B5).

When the number of subpixels functioning as one pixel is increased and subpixels that control light of red, green, blue, cyan, magenta, yellow, and the like are used in an appropriate combination, the reproducibility of halftones can be increased. Thus, display quality can be increased.

The display apparatus according to one embodiment of the present invention can reproduce the color gamut of various standards. For example, the display apparatus according to one embodiment of the present invention can reproduce the color gamut of the PAL (Phase Alternating Line) standard and the NTSC (National Television System Committee) standard used for TV broadcasting; the sRGB (standard RGB) standard and the Adobe RGB standard widely used for display apparatuses used in electronic devices such as personal computers, digital cameras, and printers; the ITU-R BT.709 (International Telecommunication Union Radiocommunication Sector Broadcasting Service (Television) 709) standard used for HDTV (High Definition Television, also referred to Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

Using the pixels 240 arranged in a matrix of 1920×1080, the display apparatus 100 that can perform full color display with a resolution of what is called full high definition (also referred to as "2K resolution", "2K1K", "2K", or the like) can be achieved. For example, using the pixels 240 arranged in a matrix of 3840×2160, the display apparatus 100 that can perform full color display with a resolution of what is called ultra high definition (also referred to as "4K resolution", "4K2K", "4K", or the like) can be achieved. For example, using the pixels 240 arranged in a matrix of 7680×4320, the display apparatus 100 that can perform full color display with a resolution of what is called super high definition (also referred to as "8K resolution", "8K4K", "8K", or the like) can be achieved. By increasing the number of pixels 240, the display apparatus 100 that can perform full-color display with 16K or 32K resolution can also be achieved.

<Circuit Structure Example of Pixel 230>

Figure 16:
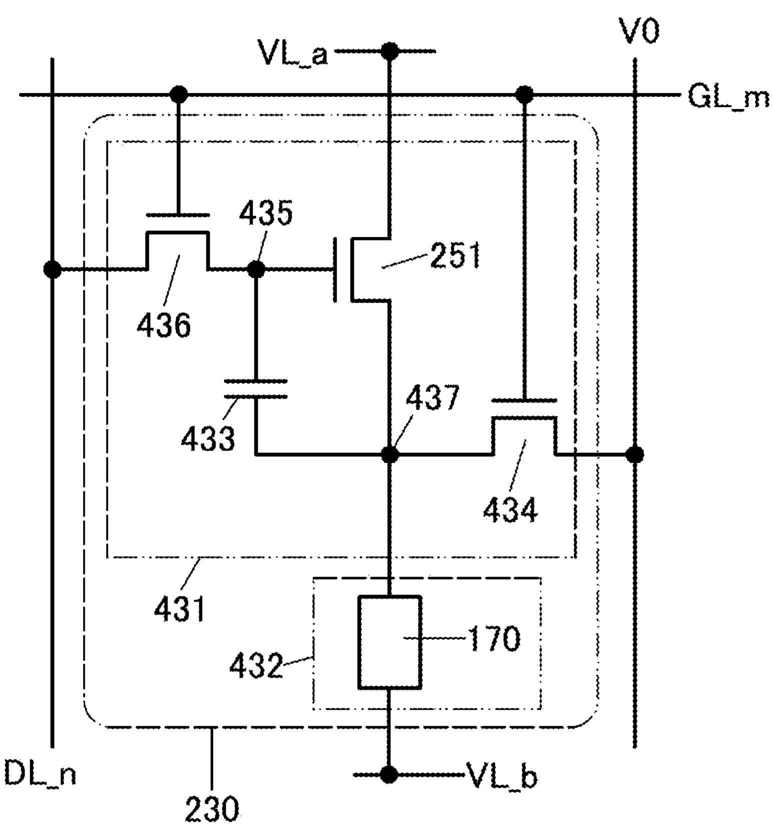
FIG. 16 is a diagram illustrating a structure example of a pixel circuit.

FIG. 16 is a diagram illustrating a circuit structure example of the pixel 230. The pixel 230 includes a pixel circuit 431 and a display element 432.

Each of the wirings 236 is electrically connected to the n pixel circuits 431 in the corresponding row among the pixel circuits 431 arranged in m rows and n columns in the display region 235. Each of the wirings 237 is electrically connected to the m pixel circuits 431 arranged in the corresponding column among the pixel circuits 431 arranged in m rows and n columns.

The pixel circuit 431 includes a transistor 436, a capacitor 433, the transistor 251, and a transistor 434. The pixel circuit 431 is electrically connected to the light-emitting element 170 functioning as the display element 432.

One of a source electrode and a drain electrode of the transistor 436 is electrically connected to a wiring to which a data signal (also referred to as "video signal") is supplied (hereinafter referred to as a signal line DL_n). A gate electrode of the transistor 436 is electrically connected to a wiring to which a gate signal is supplied (hereinafter referred to as a scan line GL_m). The signal line DL_n and the scan line GL_m correspond to the wiring 237 and the wiring 236, respectively.

The transistor 436 has a function of controlling writing of the data signal to a node 435.

One of a pair of electrodes of the capacitor 433 is electrically connected to the node 435, and the other is electrically connected to a node 437. The other of the source electrode and the drain electrode of the transistor 436 is electrically connected to the node 435.

The capacitor 433 has a function of a storage capacitor for storing data written to the node 435.

One of a source electrode and a drain electrode of the transistor 251 is electrically connected to a potential supply line VL_a, and the other is electrically connected to the node 437. Furthermore, a gate electrode of the transistor 251 is electrically connected to the node 435.

One of a source electrode and a drain electrode of the transistor 434 is electrically connected to a potential supply line V0, and the other is electrically connected to the node 437. Furthermore, a gate electrode of the transistor 434 is electrically connected to the scan line GL_m.

One of an anode and a cathode of the light-emitting element 170 is electrically connected to a potential supply line VL_b, and the other is electrically connected to the node 437.

As the light-emitting element 170, an organic electroluminescent element (also referred to as an organic EL element) or the like can be used, for example. Note that the light-emitting element 170 is not limited thereto; an inorganic EL element formed of an inorganic material may be used, for example.

Note that as a power supply potential, a potential on the relatively high potential side or a potential on the relatively low potential side can be used, for example. A power supply potential on the high potential side is referred to as a high power supply potential (also referred to as "VDD"), and a power supply potential on the low potential side is referred to as a low power supply potential (also referred to as "VSS"). A ground potential can be used as the high power supply potential or the low power supply potential. For example, in the case where the high power supply potential is a ground potential, the low power supply potential is a potential lower than the ground potential, and in the case where the low power supply potential is a ground potential, the high power supply potential is a potential higher than the ground potential.

A high power supply potential VDD is supplied to one of the potential supply line VL_a and the potential supply line VL_b, and a low power supply potential VSS is supplied to the other, for example.

In the display apparatus including the pixel circuit 431, the pixel circuits 431 are sequentially selected row by row by the circuit included in the peripheral circuit region 232, whereby the transistors 436 and the transistors 434 are brought into an on state and a data signal is written to the nodes 435.

When the transistors 436 and the transistors 434 are brought into an off state, the pixel circuits 431 in which the data has been written to the nodes 435 are brought into a holding state. Furthermore, the amount of current flowing between the source electrode and the drain electrode of the transistor 251 is controlled in accordance with the potential of the data written to the node 435. The light-emitting element 170 emits light with a luminance corresponding to the amount of current flow. This operation is sequentially performed row by row; thus, an image can be displayed.

The structures described in this embodiment can be used in an appropriate combination with the structures described in the other embodiments and the like.

Embodiment 3

In this embodiment, light-emitting devices each of which can be used as the light-emitting element 170 are described.

Figure 17A:
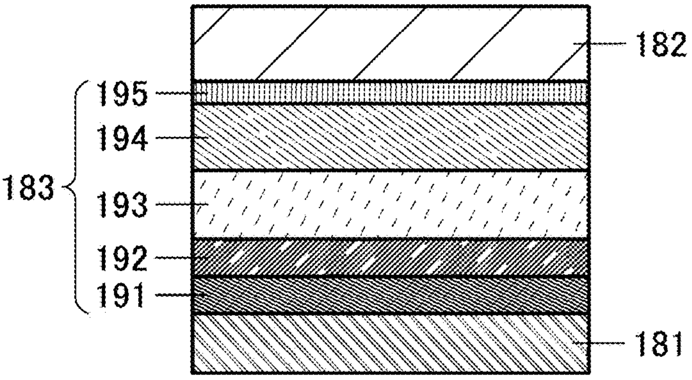
FIG. 17A to FIG. 17C are diagrams illustrating structure examples of a light-emitting element.

FIG. 17A is a diagram illustrating a light-emitting device. The light-emitting device illustrated in FIG. 17A includes a first electrode 181, a second electrode 182, and an EL layer 183. The first electrode 181, the second electrode 182, and the EL layer 183 correspond respectively to the electrode 171, the electrode 173, and the EL layer 172 that are described in the above embodiment.

The EL layer 183 includes a light-emitting layer 193, and the light-emitting layer 193 contains a light-emitting material. A hole-injection layer 191 and a hole-transport layer 192 are provided between the light-emitting layer 193 and the first electrode 181.

The light-emitting layer 193 may contain a host material in addition to the light-emitting material. The host material is an organic compound having a carrier-transport property. The host material is not limited to one kind of material, and a plurality of kinds of materials may be contained. In such a structure, the plurality of kinds of organic compounds are preferably an organic compound having an electron-transport property and an organic compound having a hole-transport property, in which case the carrier balance in the light-emitting layer 193 can be adjusted. The plurality of organic compounds may be organic compounds each having an electron-transport property, and when the electron-transport properties thereof are different from each other, the electron-transport property of the light-emitting layer 193 can also be adjusted. Proper adjustment of the carrier balance enables a long-life light-emitting device to be provided. The plurality of organic compounds that are host materials may form an exciplex, or the host material and the light-emitting material may form an exciplex. The exciplex having an appropriate emission wavelength allows efficient energy transfer to the light-emitting material, achieving a light-emitting device with a high efficiency and a long lifetime.

Note that although FIG. 17A illustrates an electron-transport layer 194 and an electron-transport layer 195 in the EL layer 183 in addition to the light-emitting layer 193, the hole-injection layer 191, and the hole-transport layer 192, the structure of the light-emitting device is not limited thereto. Any of these layers may be omitted or a layer having another function may be included.

Next, examples of specific structures and materials of the above light-emitting device are described. The first electrode 181 is preferably formed using a metal, an alloy, or a conductive compound having a high work function (specifically, 4.0 eV or more), a mixture thereof, or the like. Specific examples include indium oxide-tin oxide (ITO: Indium Tin Oxide), indium oxide-tin oxide containing silicon or silicon oxide, indium oxide-zinc oxide, and indium oxide containing tungsten oxide and zinc oxide (IWZO). These conductive metal oxide films are usually formed by a sputtering method but may also be formed by application of a sol-gel method or the like. Note that when a composite material described later is used for a layer that is in contact with the first electrode 181 in the EL layer 183, an electrode material can be selected regardless of its work function.

Figure 17B:
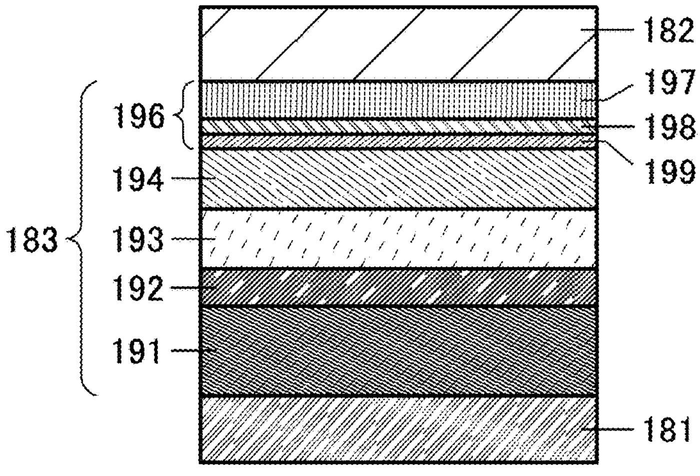

Although the EL layer 183 preferably has a stacked-layer structure, there is no particular limitation on the stacked-layer structure, and various layer structures such as a hole-injection layer, a hole-transport layer, a light-emitting layer, an electron-transport layer, an electron-injection layer, a carrier-blocking layer, an exciton-blocking layer, and a charge-generation layer can be employed. In this embodiment, two kinds of structures are described as examples: the structure including the electron-transport layer 194 and the electron-transport layer 195 in addition to the hole-injection layer 191, the hole-transport layer 192, and the light-emitting layer 193 as illustrated in FIG. 17A; and the structure including the electron-transport layer 194 and a charge-generation layer 196 in addition to the hole-injection layer 191, the hole-transport layer 192, and the light-emitting layer 193 as illustrated in FIG. 17B. Materials forming the layers are specifically described below.

The hole-injection layer 191 contains a substance having an acceptor property. Either an organic compound or an inorganic compound can be used as the substance having an acceptor property.

As the substance having an acceptor property, it is possible to use a compound having an electron-withdrawing group (a halogen group or a cyano group); for example, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile can be given.

As the substance having an acceptor property, molybdenum oxide, vanadium oxide, ruthenium oxide, tungsten oxide, manganese oxide, or the like can be used, other than the above-described organic compounds. Alternatively, the hole-injection layer 191 can be formed using phthalocyanine (abbreviation: H2Pc), a phthalocyanine complex compound such as copper phthalocyanine (abbreviation: CuPc), an aromatic amine compound, polymer such as poly(3,4-ethylenedioxythiophene)/(polystyrenesulfonic acid) (abbreviation: PEDOT/PSS), or the like. The substance having an acceptor property can extract electrons from an adjacent hole-transport layer (or hole-transport material) by application of an electric field.

Alternatively, a composite material in which a material having a hole-transport property contains the above-described substance having an acceptor property can be used for the hole-injection layer 191. By using a composite material in which a material having a hole-transport property contains an acceptor substance, a material used to form an electrode can be selected regardless of its work function. In other words, besides a material having a high work function, a material having a low work function can also be used for the first electrode 181.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material is preferably a substance having a hole mobility higher than or equal to $1\times10^{-6}$ $cm^2/Vs$.

Further preferably, the material having a hole-transport property that is used in the composite material is a substance having a relatively deep HOMO level higher than or equal to −5.7 eV and lower than or equal to −5.4 eV. The relatively deep HOMO level of the material having a hole-transport property used for the composite material makes it easy to inject holes into the hole-transport layer 192 and to obtain a light-emitting device with a long lifetime.

The formation of the hole-injection layer 191 can improve the hole-injection property, whereby a light-emitting device having a low driving voltage can be obtained. The organic compound having an acceptor property is an easy-to-use material because evaporation is easy and its film can be easily formed.

The hole-transport layer 192 contains a material having a hole-transport property. The material having a hole-transport property preferably has a hole mobility higher than or equal to $1\times10^{-6}$ $cm^2/Vs$. Examples of the material having a hole-transport property include 4,4'-bis[N-(1-naphthyl)-N-phenylamino]biphenyl (abbreviation: NPB), N,N-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). Note that any of the substances given as examples of the material having a hole-transport property that is used for the composite material for the hole-injection layer 191 can also be suitably used as the material included in the hole-transport layer 192.

The light-emitting layer 193 contains a light-emitting substance and a host material. The light-emitting layer 193 may additionally contain other materials. Alternatively, the light-emitting layer 193 may be a stack of two layers with different compositions.

The light-emitting substance may be a fluorescent substance, a phosphorescent substance, a substance exhibiting thermally activated delayed fluorescence (TADF), or another light-emitting substance.

Examples of the material that can be used as a fluorescent substance in the light-emitting layer 193 include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), and N,N'-diphenyl-N,N'-bis[4-(9-phenyl-9H-fluoren-9-yl)phenyl]pylene-1,6-diamine (abbreviation: 1,6FLPAPrn). Other fluorescent substances can also be used.

In the case where a phosphorescent substance is used as a light-emitting substance in the light-emitting layer 193, examples of the usable material include an organometallic iridium complex including a 4H-triazole skeleton, an organometallic iridium complex including a 1H-triazole skeleton, an organometallic iridium complex including an imidazole skeleton, and an organometallic iridium complex including a phenylpyridine dielectric with an electron-withdrawing group as a ligand. These are compounds exhibiting blue phosphorescent light, and are compounds having an emission wavelength peak at 440 nm to 520 nm.

Other examples include an organometallic iridium complex including a pyrimidine skeleton, an organometallic iridium complex including a pyrazine skeleton, an organometallic iridium complex including a pyridine skeleton, and a rare earth metal complex such as tris(acetylacetonato)(monophenanthroline)terbium(III) (abbreviation: $[Tb(acac)_3(Phen)]$). These are compounds mainly exhibiting green phosphorescent light, and have an emission wavelength peak at 500 nm to 600 nm. Note that an organometallic iridium complex having a pyrimidine skeleton is particularly preferable because of its distinctively high reliability and emission efficiency.

Other examples include an organometallic iridium complex including a pyrimidine skeleton, an organometallic iridium complex including a pyrazine skeleton, an organometallic iridium complex including a pyridine skeleton, a platinum complex, and a rare earth metal complex. These are compounds exhibiting red phosphorescent light, and have an emission peak at 600 nm to 700 nm. An organometallic iridium complex having a pyrazine skeleton can provide red light emission with favorable chromaticity.

Besides the above-described phosphorescent compounds, other known phosphorescent substances may be selected and used.

Examples of the TADF material include a fullerene, a derivative thereof, an acridine, a derivative thereof, and an eosin derivative. Other examples include a metal-containing porphyrin, such as a porphyrin containing magnesium (Mg), zinc (Zn), cadmium (Cd), tin (Sn), platinum (Pt), indium (In), palladium (Pd), or the like.

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into light.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

In the case where a TADF material is used as the light-emitting substance, the S1 level of the host material is preferably higher than the S1 level of the TADF material. In addition, the T1 level of the host material is preferably higher than the T1 level of the TADF material.

As the host material in the light-emitting layer, various carrier-transport materials such as a material having an electron-transport property, a material having a hole-transport property, and the above-described TADF material can be used.

The material having a hole-transport property is preferably an organic compound having an amine skeleton or a π-electron rich heteroaromatic ring skeleton. Examples include a compound having an aromatic amine skeleton, a compound having a carbazole skeleton, a compound having a thiophene skeleton, and a compound having a furan skeleton. Among the above, the compound having an aromatic amine skeleton and the compound having a carbazole skeleton are preferable because these have favorable reliability, have high hole-transport properties, and contribute to a reduction in driving voltage.

As the material having an electron-transport property, for example, a metal complex or an organic compound having a π-electron deficient heteroaromatic ring skeleton is preferable. Examples of the organic compound having a π-electron deficient heteroaromatic ring skeleton include a heterocyclic compound having a polyazole skeleton, a heterocyclic compound having a diazine skeleton, a heterocyclic compound having a triazine skeleton, and a heterocyclic compound having a pyridine skeleton. Among the above materials, the heterocyclic compound having a diazine skeleton, the heterocyclic compound having a triazine skeleton, and the heterocyclic compound having a pyridine skeleton have high reliability and thus are preferable. In particular, the heterocyclic compound having a diazine (pyrimidine or pyrazine) skeleton has a high electron-transport property and contributes to a reduction in driving voltage.

As the TADF material that can be used as the host material, any of the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased.

In the case where a fluorescent substance is used as the light-emitting substance, a material including an anthracene skeleton is suitable as the host material. The use of a substance having an anthracene skeleton as a host material for a fluorescent substance makes it possible to achieve a light-emitting layer with favorable emission efficiency and durability.

The electron-transport layer 194 is a layer containing a substance having an electron-transport property. As the substance having an electron-transport property, it is possible to use any of the above-listed substances having electron-transport properties that can be used as the host material.

The electron mobility of the electron-transport layer 194 in the case where the square root of the electric field strength [V/cm] is 600 is preferably higher than or equal to $1\times10^{-7}$ $cm^2/Vs$ and lower than or equal to $5\times10^{-5}$ $cm^2/Vs$. Lowering the electron-transport property of the electron-transport layer 194 enables control of the amount of electrons injected into the light-emitting layer and can prevent the light-emitting layer from having excess electrons. The electron-transport layer preferably contains a material having an electron-transport property and an alkali metal, an alkali metal itself, a compound thereof, or a complex thereof. It is particularly preferable that this structure be employed when the hole-injection layer is formed using a composite material that contains a material having a hole-transport property with a relatively deep HOMO level higher than or equal to −5.7 eV and lower than or equal to −5.4 eV, in which case a favorable lifetime can be achieved. In this case, the material having an electron-transport property preferably has a HOMO level of −6.0 eV or higher.

As the electron-transport layer 195, a layer containing an alkali metal, an alkaline earth metal, or a compound thereof, such as lithium fluoride (LiF), cesium fluoride (CsF), calcium fluoride ($CaF_2$), or 8-hydroxyquinolinato-lithium (abbreviation: Liq), may be provided between the electron-transport layer 194 and the second electrode 182. An electrode or a layer that is formed using a substance with an electron-transport property and includes an alkali metal, an alkaline earth metal, or a compound thereof can be used as the electron-transport layer 195. Examples of the electrode include a substance in which electrons are added at high concentration to an oxide where calcium and aluminum are mixed.

Note that as the electron-transport layer 195, it is possible to use a layer that contains a substance having an electron-transport property (preferably an organic compound having a bipyridine skeleton) and contains a fluoride of the alkali metal or the alkaline earth metal at a concentration higher than or equal to that at which the electron-transport layer 195 becomes in a microcrystalline state (50 wt % or higher). Since the layer has a low refractive index, a light-emitting device having more favorable external quantum efficiency can be provided.

Instead of the electron-transport layer 195, the charge-generation layer 196 may be provided (FIG. 17B). The charge-generation layer 196 refers to a layer capable of injecting holes into a layer in contact therewith on the cathode side and injecting electrons into a layer in contact therewith on the anode side when supplied with a potential. The charge-generation layer 196 includes at least a P-type layer 197. The P-type layer 197 is preferably formed using any of the composite materials given above as examples of the material that can form the hole-injection layer 191. The P-type layer 197 may be formed by stacking a film containing the above acceptor material as a material included in the composite material and a film containing the above hole-transport material. When a potential is applied to the P-type layer 197, electrons are injected into the electron-transport layer 194 and holes are injected into the second electrode 182 that is a cathode; thus, the light-emitting device operates. Since the organic compound of one embodiment of the present invention has a low refractive index, using the organic compound for the P-type layer 197 enables the light-emitting device to have high external quantum efficiency.

Note that one or both of an electron-relay layer 198 and an electron-injection buffer layer 199 are preferably provided in the charge-generation layer 196 in addition to the P-type layer 197.

The electron-relay layer 198 contains at least a substance having an electron-transport property and has a function of preventing an interaction between the electron-injection buffer layer 199 and the P-type layer 197 to transfer electrons smoothly. The LUMO level of the substance having an electron-transport property contained in the electron-relay layer 198 is preferably between the LUMO level of an acceptor substance in the P-type layer 197 and the LUMO level of a substance contained in a layer of the electron-transport layer 194 in contact with the charge-generation layer 196. A specific energy level of the LUMO level of the substance having an electron-transport property used for the electron-relay layer 198 is higher than or equal to −5.0 eV, preferably higher than or equal to −5.0 eV and lower than or equal to −3.0 eV. Note that as the substance having an electron-transport property used for the electron-relay layer 198, a phthalocyanine-based material or a metal complex having a metal-oxygen bond and an aromatic ligand is preferably used.

For the electron-injection buffer layer 199, a substance having a high electron-injection property, such as an alkali metal, an alkaline earth metal, a rare earth metal, or a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)), can be used.

In the case where the electron-injection buffer layer 199 contains the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, or a compound thereof (e.g., an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). Note that as the substance having an electron-transport property, a material similar to the above-described material forming the electron-transport layer 194 can be used for the formation.

As a substance forming the second electrode 182, a metal, an alloy, an electrically conductive compound, or a mixture thereof having a low work function (specifically, 3.8 eV or less) or the like can be used. Specific examples of such a cathode material include elements belonging to Group 1 and Group 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the second electrode 182 and the electron-transport layer, for the second electrode 182, a variety of conductive materials such as Al, Ag, ITO, and indium oxide-tin oxide containing silicon or silicon oxide can be used regardless of their work functions. Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed for the formation.

Various methods can be used as a method for forming the EL layer 183 regardless of whether it is a dry process or a wet process. For example, a vacuum evaporation method, a gravure printing method, an offset printing method, a screen printing method, an ink-jet method, a spin coating method, or the like may be used.

Different methods may be used to form the electrodes or the layers described above.

Note that the structure of the layers provided between the first electrode 181 and the second electrode 182 is not limited to the above structure. However, a structure is preferable in which a light-emitting region where holes and electrons recombine is provided at a position away from the first electrode 181 and the second electrode 182 so as to prevent quenching caused by the proximity of the light-emitting region and a metal used for electrodes or carrier-injection layers.

Furthermore, in order to inhibit energy transfer from an exciton generated in the light-emitting layer, it is preferable to form the hole-transport layer and the electron-transport layer that are in contact with the light-emitting layer 193, particularly a carrier-transport layer closer to the recombination region in the light-emitting layer 193, using the light-emitting material of the light-emitting layer or a substance having a wider band gap than the light-emitting material contained in the light-emitting layer.

Next, an embodiment of a light-emitting device with a structure where a plurality of light-emitting units are stacked (also referred to as a stacked-type element or a tandem element) will be described with reference to FIG. 17C. This light-emitting device is a light-emitting device including a plurality of light-emitting units between an anode and a cathode. One light-emitting unit has substantially the same structure as the EL layer 183, which is illustrated in FIG. 17A. In other words, the light-emitting device illustrated in FIG. 17C can be regarded as a light-emitting device including a plurality of light-emitting units, and the light-emitting device illustrated in FIG. 17A or FIG. 17B can be regarded as a light-emitting device including one light-emitting unit.

Figure 17C:
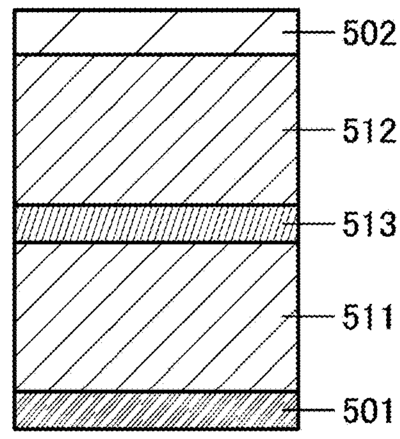

In FIG. 17C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the first electrode 181 and the second electrode 182 in FIG. 17A, and the same substance as what is given in the description for FIG. 17A can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied to the anode 501 and the cathode 502. That is, in FIG. 17C, the charge-generation layer 513 injects electrons into the first light-emitting unit 511 and injects holes into the second light-emitting unit 512 in the case where a voltage is applied such that the potential of the anode is higher than the potential of the cathode.

The charge-generation layer 513 is preferably formed to have a structure similar to that of the charge-generation layer 196 described with reference to FIG. 17B. A composite material of an organic compound and a metal oxide has an excellent carrier-injection property and an excellent carrier-transport property; thus, low-voltage driving and low-current driving can be achieved. Note that in the case where the anode-side surface of a light-emitting unit is in contact with the charge-generation layer 513, the charge-generation layer 513 can also serve as a hole-injection layer of the light-emitting unit; therefore, a hole-injection layer is not necessarily provided in the light-emitting unit.

In the case where the electron-injection buffer layer 199 is provided in the charge-generation layer 513, the electron-injection buffer layer 199 serves as an electron-injection layer in the light-emitting unit on the anode side; therefore, an electron-injection layer is not necessarily formed in the light-emitting unit on the anode side.

The light-emitting device having two light-emitting units is described with reference to FIG. 17C; however, the same can also be applied to a light-emitting device in which three or more light-emitting units are stacked. With a plurality of light-emitting units partitioned by the charge-generation layer 513 between a pair of electrodes as in the light-emitting device of this embodiment, it is possible to provide a long-life element that can emit high-luminance light with a current density kept low. A light-emitting apparatus which can be driven at a low voltage and has low power consumption can be provided.

Furthermore, when emission colors of the light-emitting units are different, light emission of a desired color can be obtained from the light-emitting device as a whole. For example, in a light-emitting device having two light-emitting units, emission colors of red and green are obtained in the first light-emitting unit and an emission color of blue is obtained in the second light-emitting unit, whereby a light-emitting device that emits white light as the whole light-emitting device can be obtained.

The above-described layers and electrodes such as the EL layer 183, the first light-emitting unit 511, the second light-emitting unit 512, and the charge-generation layer can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the layers or electrodes.

The structures described in this embodiment can be used in an appropriate combination with the structures described in the other embodiments and the like.

Embodiment 4

In this embodiment, examples of an electronic device that can include a display apparatus of one embodiment of the present invention will be described.

The display apparatus of one embodiment of the present invention can be used in a display portion of an electronic device. Thus, an electronic device with high display quality can be achieved. An electronic device with an extremely high resolution can be achieved. A highly reliable electronic device can be achieved.

Examples of electronic devices including the display apparatus or the like of one embodiment of the present invention include display apparatuses such as televisions and monitors, lighting devices, desktop or laptop personal computers, word processors, image reproduction devices which reproduce still images or moving images stored in recording media such as DVDs (Digital Versatile Discs), portable CD players, radios, tape recorders, headphone stereos, stereos, table clocks, wall clocks, cordless phone handsets, transceivers, car phones, cellular phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Other examples include industrial equipment such as guide lights, traffic lights, conveyor belts, elevators, escalators, industrial robots, power storage systems, and power storage devices for leveling the amount of power supply and smart grid. In addition, moving objects and the like driven by fuel engines and electric motors using power from power storage units, and the like may also be included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention can be incorporated along a curved surface of an inside wall or an outside wall of a house or a building or the interior or the exterior of a car.

The electronic device of one embodiment of the present invention may include a secondary battery (battery), and it is preferable that the secondary battery be capable of being charged by contactless power transmission.

Examples of the secondary battery include a lithium ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, a video, data, and the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Furthermore, an electronic device including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that functions of the electronic device of one embodiment of the present invention are not limited thereto, and the electronic devices can have a variety of functions.

The display apparatus of one embodiment of the present invention can display images with an extremely high resolution. Thus, the light-emitting apparatus of one embodiment of the present invention can be suitably used especially for a portable electronic device, a wearable electronic device (wearable device), an e-book reader, and the like. In addition, the display apparatus can be suitably used for a VR (Virtual Reality) device, an AR (Augmented Reality) device, and the like.

Figure 18A:
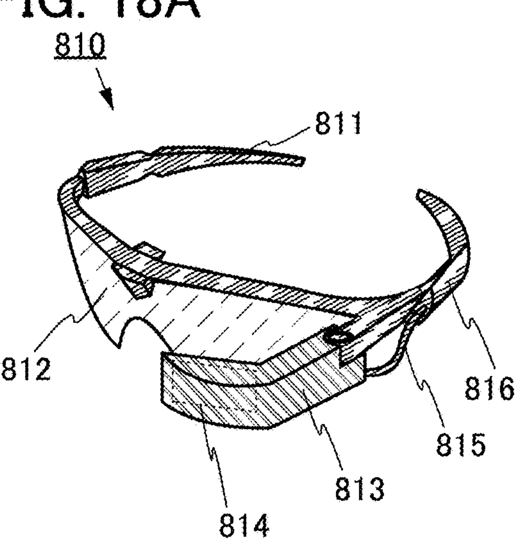
FIG. 18A to FIG. 18F are diagrams illustrating examples of electronic devices.

FIG. 18A illustrates an appearance of a head-mounted display 810. The head-mounted display 810 includes a mounting portion 811, a lens 812, a main body 813, a display portion 814, a cable 815, and the like. A battery 816 is incorporated in the mounting portion 811. The display apparatus of one embodiment of the present invention can be used in the display portion 814.

The cable 815 supplies electric power from the battery 816 to the main body 813. The main body 813 includes a wireless receiver or the like and can display received image information, such as image data, on the display portion 814. The movement of the eyeball and/or the eyelid of a user is captured by a camera provided in the main body 813 and then the sight line of the user are calculated using the information to utilize the sight line of the user as an input means.

A plurality of electrodes may be provided in the mounting portion 811 at positions in contact with the user. The main body 813 may have a function of recognizing the user's sight line by sensing current flowing through the electrodes in accordance with the movement of the user's eyeball. The main body 813 may have a function of sensing current flowing through the electrodes to monitor the user's pulse. The mounting portion 811 may include various sensors such as a temperature sensor, a pressure sensor, and an acceleration sensor and may have a function of displaying the user's biological information on the display portion 814. The main body 813 may sense the movement of the user's head or the like to change an image displayed on the display portion 814 in synchronization with the movement.

Figure 18B:
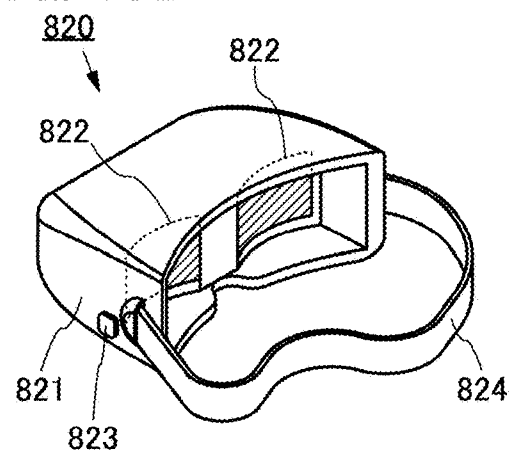

FIG. 18B illustrates an appearance of a head-mounted display 820. The head-mounted display 820 is a goggles-type information processing device.

The head-mounted display 820 includes a housing 821, two display portions 822, an operation button 823, and a fixing band 824. Since the head-mounted display 820 includes the two display portions 822, the user's eyes can see their respective display portions. This allows a high-definition image to be displayed even when three-dimensional display using parallax or the like is performed. In addition, the display portion 822 is curved around an arc with the user's eye as an approximate center. This keeps a certain distance between the user's eye and the display surface of the display portion, enabling the user to see a more natural image. Even when the luminance and/or chromaticity of light from the display portion is changed depending on the angle at which the user see it, since the user's eye is positioned in a normal direction of the display surface of the display portion, the influence of the change can be substantially ignorable and thus a more realistic image can be displayed.

The operation button 823 has a function of a power button or the like. A button other than the operation button 823 may be included.

The display apparatus of one embodiment of the present invention can be used in the display portion 822. The display apparatus of one embodiment of the present invention has an extremely high resolution; thus, the pixels are less likely to be perceived by a user and a more realistic image can be displayed.

Figure 18C:
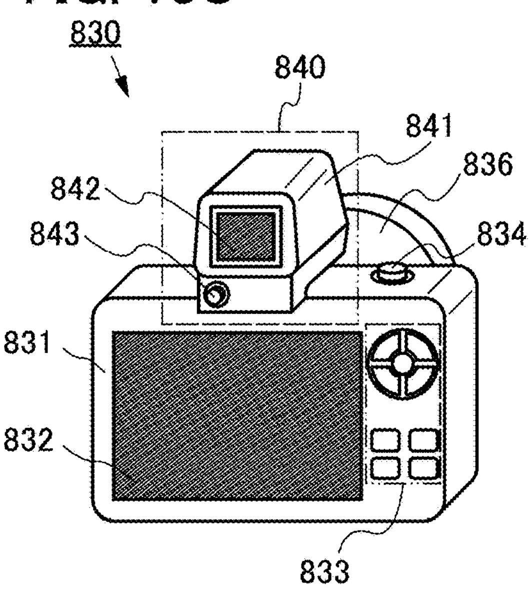

FIG. 18C illustrates an appearance of a camera 830 to which a finder 840 is attached.

The camera 830 includes a housing 831, a display portion 832, operation buttons 833, a shutter button 834, and the like. Furthermore, a detachable lens 836 is attached to the camera 830.

Although the lens 836 of the camera 830 here is detachable from the housing 831 for replacement, the lens 836 may be integrated with the housing.

The camera 830 can take images at the press of the shutter button 834. In addition, the display portion 832 has a function of a touch panel, and images can also be taken by the touch on the display portion 832.

The housing 831 of the camera 830 includes a mount including an electrode, so that the finder 840, a stroboscope, or the like can be connected to the housing.

The finder 840 includes a housing 841, a display portion 842, a button 843, and the like.

The housing 841 includes a mount for engagement with the mount of the camera 830 so that the finder 840 can be attached to the camera 830. The mount includes an electrode, and a video or the like received from the camera 830 through the electrode can be displayed on the display portion 842.

The button 843 functions as a power button. The on/off state of the display portion 842 can be switched with the button 843.

The display apparatus of one embodiment of the present invention can be used in the display portion 832 of the camera 830 and the display portion 842 of the finder 840.

Although the camera 830 and the finder 840 are separate and detachable electronic devices in FIG. 18C, a finder including the display apparatus of one embodiment of the present invention may be built into the housing 831 of the camera 830.

Figure 18D:
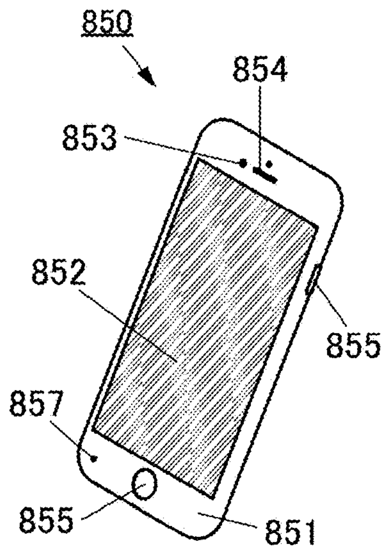

An information terminal 850 illustrated in FIG. 18D includes a housing 851, a display portion 852, a microphone 857, a speaker portion 854, a camera 853, an operation switch 855, and the like. The display apparatus of one embodiment of the present invention can be used in the display portion 852. In addition, the display portion 852 has a function of a touch panel. The information terminal 850 also includes an antenna, a battery, and the like inside the housing 851. The information terminal 850 can be used as, for example, a smartphone, a mobile phone, a tablet information terminal, a tablet personal computer, an e-book reader, or the like.

Figure 18E:
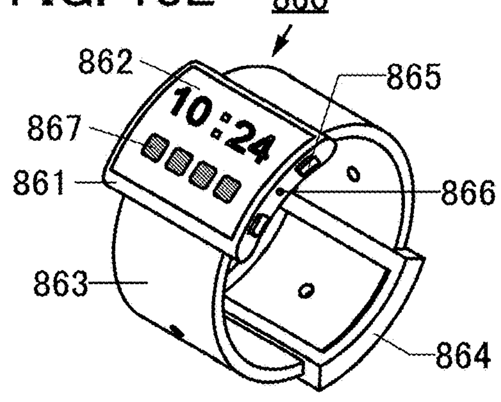

FIG. 18E illustrates an example of a watch-type information terminal. An information terminal 860 includes a housing 861, a display portion 862, a band 863, a buckle 864, an operation switch 865, an input/output terminal 866, and the like. In addition, the information terminal 860 includes an antenna, a battery, and the like inside the housing 861. The information terminal 860 is capable of executing a variety of applications such as mobile phone calls, e-mailing, viewing and editing texts, music reproduction, Internet communication, and a computer game.

In addition, the display portion 862 includes a touch sensor, and operation can be performed by touching the screen with a finger, a stylus, or the like. For example, with a touch on an icon 867 displayed on the display portion 862, an application can be started. The operation switches 865 can have a variety of functions such as time setting, power on/off operation, on/off operation of wireless communication, setting and cancellation of a silent mode, and setting and cancellation of a power saving mode. For example, the functions of the operation switches 865 can be set by the operation system incorporated in the information terminal 860.

The information terminal 860 can execute near field communication conformable to a communication standard. For example, mutual communication between the information terminal 860 and a headset capable of wireless communication enables hands-free calling. In addition, the information terminal 860 includes an input/output terminal 866, and can perform data transmission and reception with another information terminal through the input/output terminal 866. In addition, charging can be performed via the input/output terminal 866. Note that the charging operation may be performed by wireless power feeding without using the input/output terminal 866.

Figure 18F:
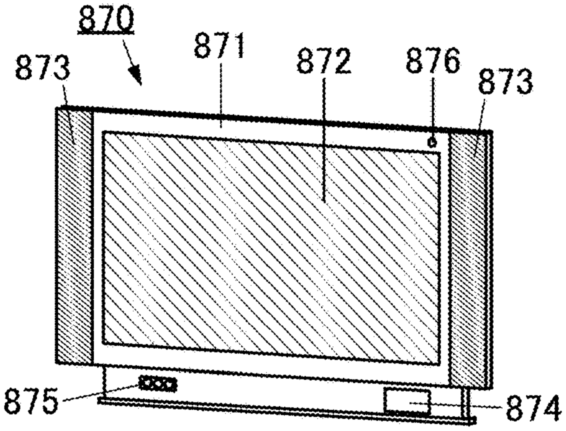

FIG. 18F is a perspective view illustrating a television device 870. The television device 870 includes a housing 871, a display portion 872, a speaker 873, an operation key 874 (including a power source switch or an operation switch), a connection terminal 875, a sensor 876 (having a function of measuring a distance, light, temperature, or the like), and the like. The display apparatus of one embodiment of the present invention can be used in the display portion 872. The display portion 872 of the television device 870 can include the display apparatus of, for example, 50 inches or more or 100 inches or more.

The structures described in this embodiment can be used in an appropriate combination with the structures described in the other embodiments and the like.

REFERENCE NUMERALS

100: display apparatus, 111: substrate, 112: insulating layer, 113: insulating layer, 114: insulating layer, 115: insulating layer, 116: insulating layer, 117: electrode, 118: conductive layer, 119: wiring, 121: substrate, 122: insulating layer, 124: FPC, 125: wiring, 131: coloring layer, 132: light-blocking layer, 133: insulating layer, 138: connection layer, 139: insulating layer, 142: adhesive layer, 151: element substrate, 152: element substrate This application is based on Japanese Patent Application Serial No. 2020-202409 filed on Dec. 7, 2020, the entire contents are hereby incorporated herein by reference.

The invention claimed is:

1. A method for fabricating a display apparatus, comprising:

a step of forming an anode over an insulating layer;

a step of forming an EL layer over the anode;

a step of forming a cathode over the EL layer;

a step of selectively removing parts of the anode, the EL layer, and the cathode to expose a top surface of the insulating layer and to form a plurality of light-emitting elements; and a step of forming a conductive layer covering the plurality of light-emitting elements, wherein the cathode of each of the plurality of light-emitting elements is electrically connected to the conductive layer, and wherein the conductive layer has a light-transmitting property.

2. The method for fabricating the display apparatus according to claim 1, further comprising:

a step of forming a plurality of transistors over a substrate; and a step of forming the insulating layer over the plurality of transistors, wherein the insulating layer comprises a surface of the insulating layer serving as a formation surface with reduced unevenness.

3. The method for fabricating the display apparatus according to claim 2, wherein the transistor comprises an oxide semiconductor.

4. The method for fabricating the display apparatus according to claim 3, wherein the oxide semiconductor comprises at least one of indium and zinc.

5. The method for fabricating the display apparatus according to claim 1, wherein an interval between two of the light-emitting elements adjacent to each other is less than or equal to 10 μm.

6. The method for fabricating the display apparatus according to claim 1, wherein each of the plurality of light-emitting elements is of a top-emission type.

7. The method for fabricating the display apparatus according to claim 1, wherein the parts of the EL layer are etched by a dry etching method in the step of selectively removing the parts of the EL layer.

8. The method for fabricating the display apparatus according to claim 1, wherein side surfaces of the anode, the EL layer, and the cathode in each of the plurality of light-emitting elements are aligned or substantially aligned with each other.

9. A method for fabricating a display apparatus, comprising:

a step of forming an anode over an insulating layer;

a step of forming an EL layer over the anode;

a step of forming a cathode over the EL layer;

a step of selectively removing parts of the anode, the EL layer, and the cathode to expose a top surface of the insulating layer and to form a plurality of light-emitting elements; and a step of forming a conductive layer over the plurality of light-emitting elements, wherein the parts of the anode, the EL layer, and the cathode are collectively removed using a resist mask, and wherein at least in two of the plurality of light-emitting elements, the cathodes of the light-emitting elements adjacent to each other are electrically connected to the conductive layer.

10. The method for fabricating the display apparatus according to claim 9, further comprising:

a step of forming a plurality of transistors over a substrate; and a step of forming the insulating layer over the plurality of transistors, wherein the insulating layer comprises a surface of the insulating layer serving as a formation surface with reduced unevenness.

11. The method for fabricating the display apparatus according to claim 10, wherein the transistor comprises an oxide semiconductor.

12. The method for fabricating the display apparatus according to claim 11, wherein the oxide semiconductor comprises at least one of indium and zinc.

13. The method for fabricating the display apparatus according to claim 9, wherein an interval between the two of the light-emitting elements adjacent to each other is less than or equal to 10 μm.

14. The method for fabricating the display apparatus according to claim 9, wherein each of the plurality of light-emitting elements is of a top-emission type.

15. The method for fabricating the display apparatus according to claim 9, wherein the parts of the EL layer are etched by a dry etching method in the step of selectively removing the parts of the EL layer.

16. The method for fabricating the display apparatus according to claim 9, wherein side surfaces of the anode, the EL layer, and the cathode in each of the plurality of light-emitting elements are aligned or substantially aligned with each other.

* * * * *